US008236625B2

(12) United States Patent
Salih et al.

(10) Patent No.: US 8,236,625 B2
(45) Date of Patent: Aug. 7, 2012

(54) METHOD OF FORMING A MULTI-CHANNEL ESD DEVICE

(75) Inventors: Ali Salih, Mesa, AZ (US); Mingjiao Liu, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/299,193

(22) Filed: Nov. 17, 2011

(65) Prior Publication Data
US 2012/0064675 A1 Mar. 15, 2012

Related U.S. Application Data

(60) Division of application No. 12/860,154, filed on Aug. 20, 2010, now Pat. No. 8,089,095, which is a continuation-in-part of application No. 12/251,978, filed on Oct. 15, 2008, now Pat. No. 7,812,367.

(51) Int. Cl.
*H01L 21/18* (2006.01)
(52) U.S. Cl. ........ 438/140; 438/380; 438/983; 148/DIG. 174; 257/603; 257/E21.355; 257/E21.356
(58) Field of Classification Search ............... 438/140, 438/380, 983; 148/DIG. 174; 257/594, 603, 257/E21.355, E21.356, E29.335
See application file for complete search history.

(56) References Cited

U.S. PATENT DOCUMENTS

| | | | |
|---|---|---|---|
| 5,528,064 A * | 6/1996 | Thiel et al. .................... 257/362 |
| 5,880,511 A | 3/1999 | Yu et al. | |
| 5,990,511 A | 11/1999 | Leas | |
| 6,046,470 A * | 4/2000 | Williams et al. ............... 257/328 |
| 6,115,592 A | 9/2000 | Ueda et al. | |
| 6,121,669 A | 9/2000 | Kalb et al. | |
| 6,140,674 A | 10/2000 | Hause et al. | |
| 6,489,660 B1 | 12/2002 | Einthoven et al. | |
| 6,586,317 B1 * | 7/2003 | Vashchenko et al. ......... 438/510 |
| 6,822,295 B2 | 11/2004 | Larson | |

(Continued)

OTHER PUBLICATIONS

NUF9300 Data Sheet, Product Preview, "5-Line EMI Filter with ESD Protection", Copyright Semiconductor Components Industries, LLC, Apr. 2005—Rev. P1, Publication Order No. NUF9300/D, 6pps.
Data Sheet, SEMTECH, "uClamp3301D Low Voltage uClamp(tm) for ESD and CDE Protection, Protection Products—MicroClamp(tm)", Revision Oct. 25, 2004, Copyright 2004 Semtech Corp., 6pps.
Data Sheet, SEMTECH, RClamp0502B Ultra-Low Capacitance TVS for ESD and CDE Protection, Protection Products—RailClamp(r) Revision Apr. 5, 2005, Copyright 2005 Semtech Corp., 9pps.
Data Sheet, SEMTECH, "RClamp0514M RailClamp(r) Low Capacitance TVS Diode Array, Protection Products—RailClamp(r)", Revision Aug. 31, 2005, Copyright 2005 Semtech Corp., 11pps.
Data Sheet, SEMTECH, "RClamp05022P RClamp0524P Ultra Low Capacitance TVS Arrays, Protection Products—RailClamp(r)", Revision Sep. 19, 2006, Copyright 2006 Semtech Corp., 13pps.

*Primary Examiner* — Mary Wilczewski
(74) *Attorney, Agent, or Firm* — Robert P. Hightower

(57) ABSTRACT

In one embodiment, a two terminal multi-channel ESD device is configured to include a zener diode and a plurality of P-N diodes. In another embodiment, the ESD devices has an asymmetrical, characteristic.

7 Claims, 23 Drawing Sheets

U.S. PATENT DOCUMENTS

| | | | |
|---|---|---|---|
| 6,953,980 B2 | 10/2005 | Escoffier et al. | |
| 6,984,860 B2 | 1/2006 | Grivna et al. | |
| 7,378,900 B2 * | 5/2008 | Inoue | 327/551 |
| 7,538,395 B2 | 5/2009 | Keena et al. | 257/361 |
| 7,561,391 B2 * | 7/2009 | Mirea et al. | 361/56 |
| 7,579,632 B2 | 8/2009 | Salih et al. | 257/173 |
| 7,608,908 B1 | 10/2009 | Khemka et al. | 257/510 |
| 7,666,751 B2 * | 2/2010 | Marreiro et al. | 438/380 |
| 7,715,159 B2 * | 5/2010 | Bazzano et al. | 361/56 |
| 7,725,792 B2 * | 5/2010 | Garg et al. | 714/729 |
| 7,812,367 B2 * | 10/2010 | Salih et al. | 257/111 |
| 7,955,941 B2 * | 6/2011 | Etter et al. | 438/380 |
| 8,089,095 B2 * | 1/2012 | Salih et al. | 257/173 |
| 8,110,448 B2 * | 2/2012 | Salih et al. | 438/140 |
| 8,169,000 B2 * | 5/2012 | Chuang et al. | 257/173 |
| 8,188,572 B2 * | 5/2012 | Etter et al. | 257/603 |
| 2003/0205775 A1 | 11/2003 | Einthoven et al. | |
| 2006/0181385 A1 | 8/2006 | Hurley | |
| 2007/0073807 A1 | 3/2007 | Bobde | |
| 2008/0203534 A1 | 8/2008 | Xu et al. | 257/577 |
| 2009/0079032 A1 | 3/2009 | Marreiro et al. | 257/597 |
| 2010/0060349 A1 | 3/2010 | Etter et al. | 327/552 |
| 2011/0198728 A1 * | 8/2011 | Etter et al. | 257/603 |
| 2012/0007202 A1 * | 1/2012 | Mueller et al. | 257/432 |
| 2012/0008242 A1 * | 1/2012 | Salcedo | 361/56 |
| 2012/0012973 A1 * | 1/2012 | Chuang et al. | 257/510 |
| 2012/0012974 A1 * | 1/2012 | Chuang et al. | 257/510 |
| 2012/0064675 A1 * | 3/2012 | Salih et al. | 438/140 |
| 2012/0068299 A1 * | 3/2012 | Lin et al. | 257/510 |
| 2012/0080769 A1 * | 4/2012 | Sharma et al. | 257/529 |
| 2012/0091504 A1 * | 4/2012 | Davis et al. | 257/146 |

* cited by examiner

METHOD OF FORMING A MULTI-CHANNEL ESD DEVICE

CROSS-REFERENCE TO RELATED APPLICATIONS

This application is a divisional of prior U.S. patent application Ser. No. 12/860,154, filed Aug. 20, 2010 now U.S. Pat. No. 8,089,095 which is a continuation-in-part of previous U.S. patent application Ser. No. 12/251,978 entitled. "TWO TERMINAL LOW CAPACITANCE MULTI-CHANNEL ESD DEVICE" that was filed on Oct. 15, 2008 now U.S. Pat. No. 7,812,367 both of which are hereby incorporated herein by reference, and priority thereto for common subject matter is hereby claimed. This application is also related to a previously filed application entitled "MULTI-CHANNEL ESD DEVICE AND METHOD THEREFOR" having an application Ser. No 11/859,624, now U.S Pat. No. 7,579,632 which has a common assignee and a common inventor, and which is hereby incorporated herein by reference.

BACKGROUND OF THE INVENTION

The present invention relates, in general, to electronics, and more particularly, to methods of forming semiconductor devices and structures.

In the past, the semiconductor industry utilized various methods and structures to form electrostatic discharge (ESD) protection devices. According to one international specification, the International Electrotechnical Commission (IEC) specification commonly referred to as TEC 61000-4-2 (level 2), it is desirable for an ESD device to respond to a high input, voltage and current within approximately 1 nanosecond (the IEC has an address at 3, rue de Varembé, 1211 Genève 20, Switzerland).

Some of the prior ESD devices used a zener diode and a P-N junction diode to attempt to provide ESD protection. In general, the prior ESD devices had to trade-off low capacitance against having a sharp breakdown voltage characteristic. The sharp breakdown voltage characteristic was needed to provide a low clamp voltage for the ESD device. In most cases, the device structures had a high capacitance, generally greater than about one to six (1-6) picofarads. The high capacitance limited the response time of the ESD device. Some prior ESD devices operated in a punch-through mode which required the devices to have a very thin and accurately controlled epitaxial layer, generally less than about 2 microns thick, and required a low doping in the epitaxial layer. These structures generally made it difficult to accurately control the clamping voltage of the ESD device and especially difficult to control low clamping voltages, such as voltages of less than about ten volts (10 V). One example of such an ESD device was disclosed in U.S. Pat. No. 5,880,511 which issued on Mar. 9, 1999 to Bin Yu et al. Another ESD device utilized a body region of a vertical MOS transistor to form a zener diode at an interface with an underlying epitaxial layer. The doping profiles and depths used for the ESD device resulted in a high capacitance and a slow response time. Additionally, it was difficult to control the light doping levels in the thin layers which made it difficult to control the breakdown voltage of the ESD device. An example of such an ESD device was disclosed in United States patent publication number 2007/0073807 of inventor Madhur Bobde which was published on Mar. 29, 2007.

It is often desirable to form the ESD devices with two terminals so that the ESD device may be assembled into a two terminal semiconductor package.

Accordingly, it is desirable to have an electrostatic discharge (ESD) device that has two terminals, that has a low capacitance, that has a fast response time, that reacts to both a positive and a negative ESD event, that has a well controlled clamp voltage, that is easy to control in manufacturing, and that has a clamp voltage that can be controlled over a range of voltages from a low voltage to a high voltage.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a grate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. The terms first, second, third and the like in the claims or/and in the Detailed Description of the Drawings, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
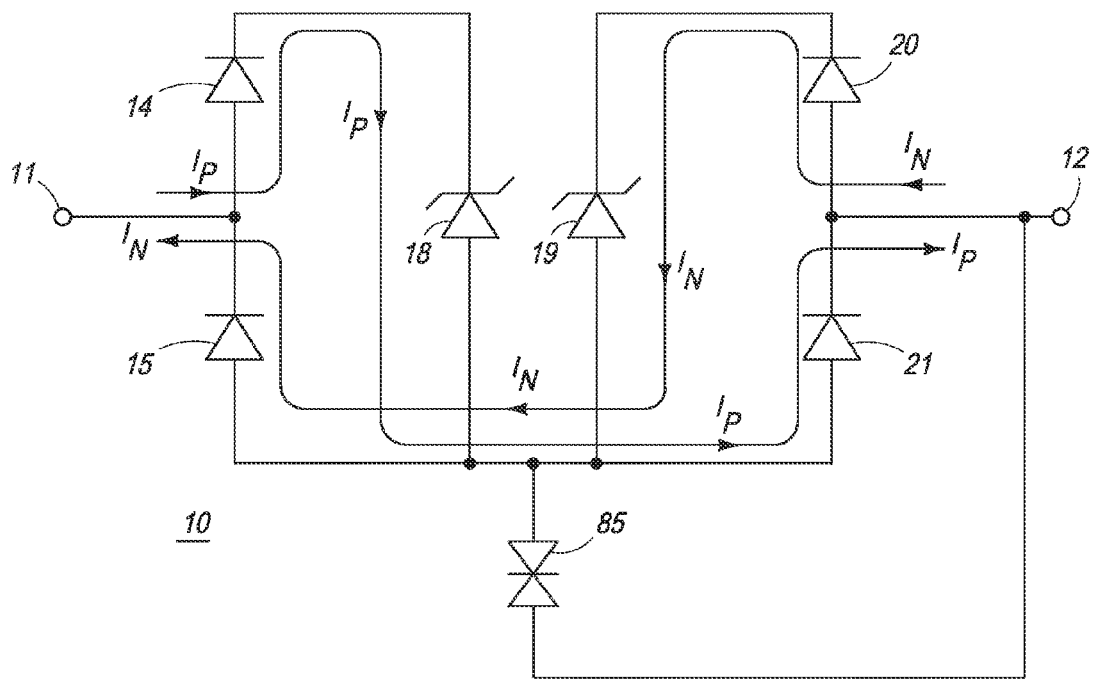
FIG. 1 schematically illustrates an embodiment of a portion of a circuit, representation of an electro-static discharge (ESD) protection device in accordance with the present invention.

FIG. 1 schematically illustrates an embodiment of a portion of an electrostatic discharge (ESD) protection device or ESD device 10 that has a low capacitance, a fast response time, and that easily can be assembled as a two terminal device within a two terminal semiconductor package. Device 10 includes two terminals, a first terminal 11 and a second terminal 12, and is configured to provide bidirectional ESD protection between terminals 11 and 12. Either of terminals 11 and 12 can be an input terminal or an output terminal. The output terminal usually is connected to another element (not shown) that is to be protected by device 10. For example, terminals 11 and 12 may be connected between two wires that form a communication line or data transmission line between two pieces of electronic equipment, or terminal 12 may be used as the output terminal and connected to the high side of a regulated power supply (such as a 5V supply) with terminal 11 connected to the low side of the power supply. Terminals 11 and 12 are readily connected to two terminals of a two terminal semiconductor package such as an SOD323 or an SOD923 package. Assembling device 10 into a two terminal semiconductor package facilitates using device 10 to replace prior two terminal ESD devices. Additionally, the configuration of device 10 allows device 10 to be assembled into the semiconductor package without regard to which of terminals 11 or 12 is connected to which terminal of the package. This advantageously eliminates assembly mistakes of reversed connections thereby reducing assembly costs and lowering the cost of device 10. Device 10 is also configured to have a low capacitance between terminals 11 and 12. Device 10 is formed to limit the maximum voltage that is formed between terminals 11 and 12 to the clamp voltage of device 10. Furthermore, device 10 is formed to have a sharp knee or sharp breakdown voltage characteristic that assists in accurately controlling the value of the clamp voltage. The low capacitance assists in providing device 10 with a fast response time. Device 10 includes a plurality of steering diode channels such as a first steering diode channel that includes a first steering diode 14, a second steering diode 21, and a zener diode 18. A second steering diode channel includes a third steering diode 20, a fourth steering diode 15, and a zener diode 19. Device 10 also includes two (2) back-to-back diodes illustrated as diodes 85 and 87. First steering diode 14 has an anode commonly connected to terminal 11 and a cathode connected to a cathode of zener diode 18. An anode of diode 18 is connected to an anode of second steering diode 21. A cathode of diode 21 is connected to terminal 12. Similarly, third steering diode 20 has an anode connected to terminal 12 and to an anode of diode 85 of the back-to-back diodes. A cathode of diode 20 is connected to a cathode of a zener diode 19. An anode of diode 19 is connected to an anode of fourth steering diode 15 and to an anode of diode 87 of the back-to-back diodes. A cathode of diode 87 is connected to a cathode of diode 85. A cathode of diode 15 is connected to terminal 11. Diodes 14, 15, 20, and 21 are formed as P-N junction diodes that have a low capacitance.

If a positive electrostatic discharge (ESD) event is received on terminal 11, terminal 11 is forced to a large positive voltage relative to terminal 12. The large positive voltage forward biases diodes 14 and 21 and reverse biases diode 18 in addition to diodes 15, 19, and 20. As the voltage between terminals 11 and 12 reaches the positive threshold voltage of device 10 (the forward voltage of diodes 14 and 21 plus the zener voltage of diode 18) a positive current (Ip) flows from terminal 11 through diode 14 to diode 18, and through diodes 18 and 21 to terminal 12. The sharp knee of diode 18 causes diode 18 to rapidly clamp the maximum voltage formed between terminals 11 and 12 to the zener voltage of diode 18 (plus the forward voltage of diodes 14 and 21). If a negative ESD event is received on terminal 11, terminal 11 is forced to a large negative voltage relative to terminal 12. The large negative voltage forward biases diodes 20 and 15, and reverse biases diode 19 in addition to diodes 14, 18, and 21. As the voltage between terminals 11 and 12 reaches the negative threshold voltage of device 10 (the forward voltage of diodes 20 and 15 plus the zener voltage of diode 19) a negative current (In) flows from terminal 12 through diode 20 to diode 19, and through diodes 19 and 15 to terminal 11. The sharp knee of diode 19 causes diode 19 to rapidly clamp the maximum voltage between terminals 11 and 12 to the zener voltage of diode 19 (plus the forward voltage of diodes 15 and 20).

Figure 2:
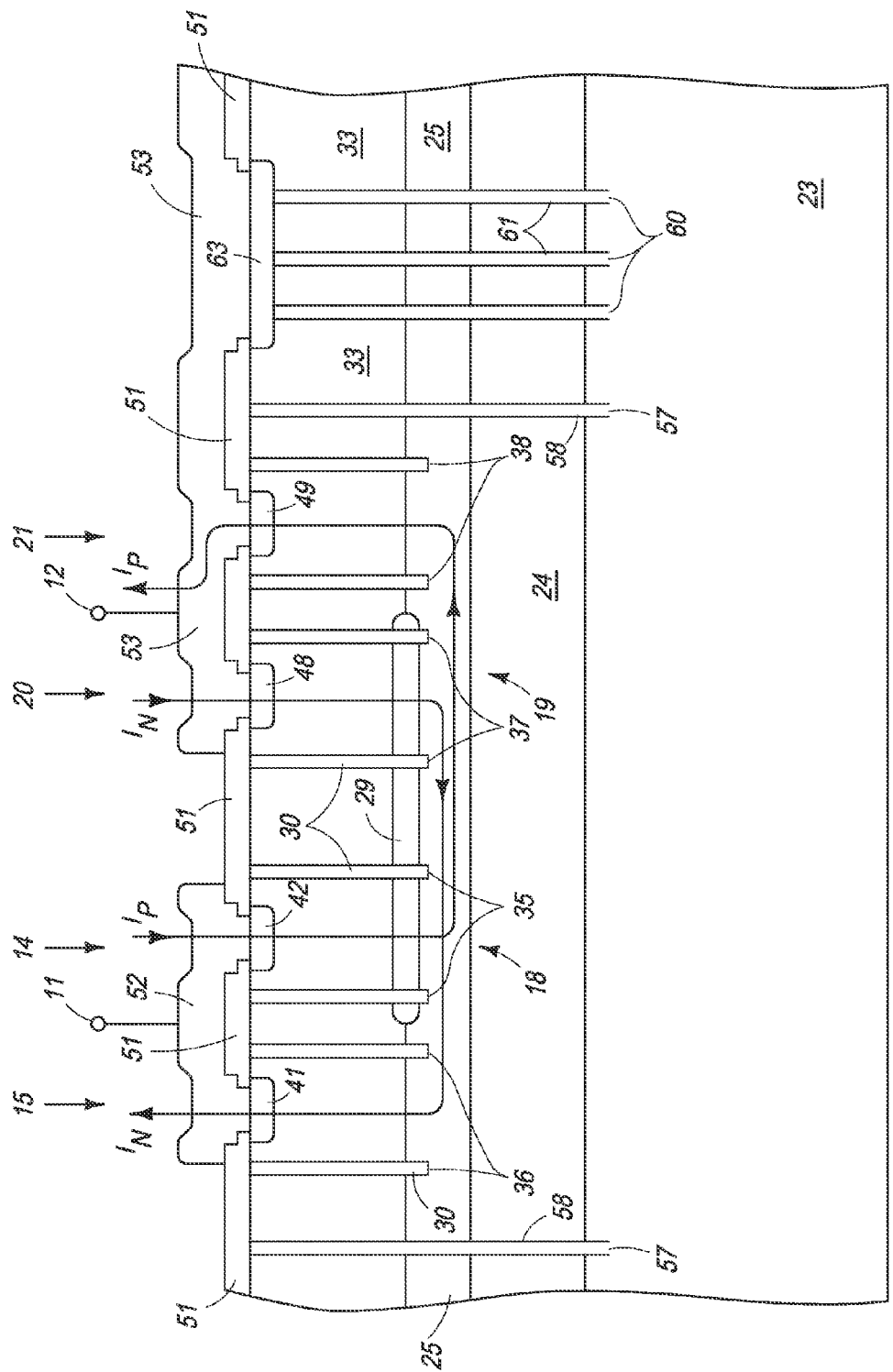
FIG. 2 illustrates a cross-sectional portion of an embodiment of the ESD device of FIG. 1 in accordance with the present invention.

FIG. 2 illustrates a cross-sectional view of a portion of an embodiment of ESD device 10. Diodes 14, 15, 18, 19, 20, and 21 are identified in a general manner by arrows. As will be seen further hereinafter, device 10 includes a bulk semiconductor substrate 23 on which an isolation layer 24 is formed. A conductor layer 25 is formed on a surface of layer 24 to conduct currents Ip and In as will be seen further hereinafter. Isolation layer 24 assists in containing currents Ip and in to flow within layer 25 and to isolate diodes 14, 15, 18, 19, 20, and 21 from bulk semiconductor substrate 23. A semiconductor layer 33 is formed on layer 25 to assist in forming diodes 14 15, 20, and 21. A semiconductor region 29 is formed near the interface of the dopants that form layer 33 and the dopants of layer 25 in order to assist in forming diodes 18 and 19.

Figure 3:
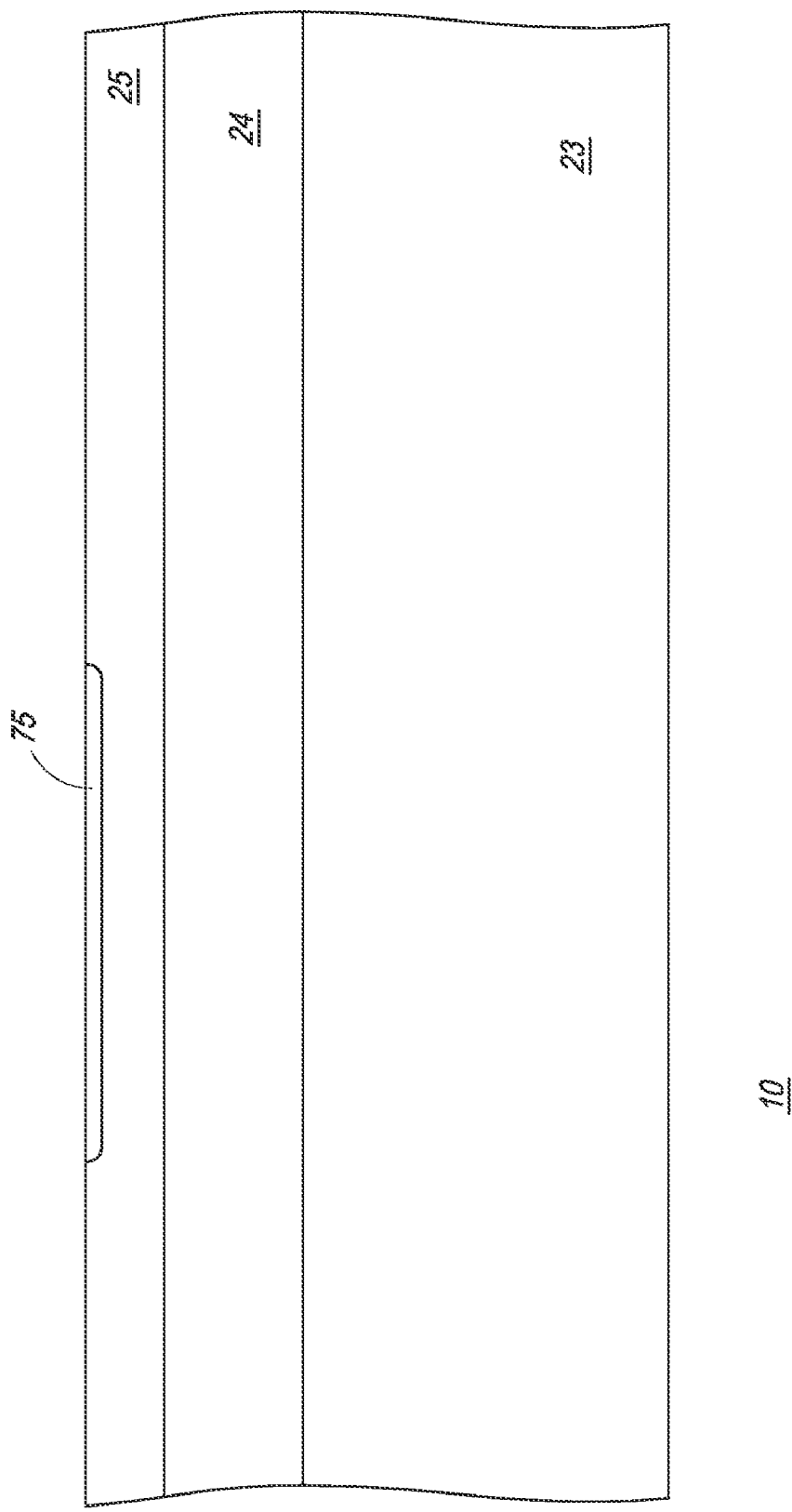
FIG. 3 through FIG. 5 illustrates various sequential stages of some of the steps in a preferred method of forming the ESD device of FIG. 1 in accordance with the present invention.
Figure 4:
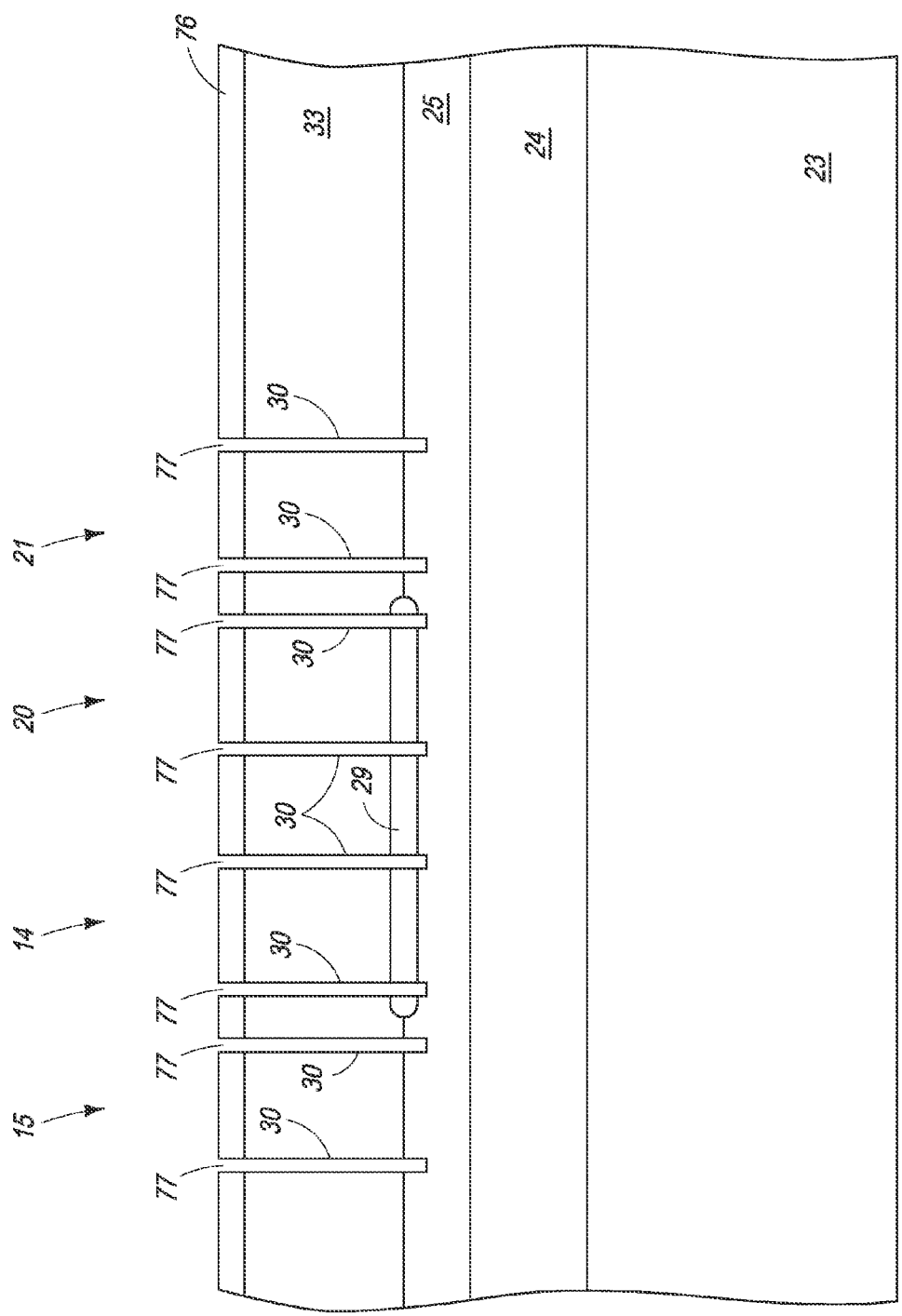
Figure 5:
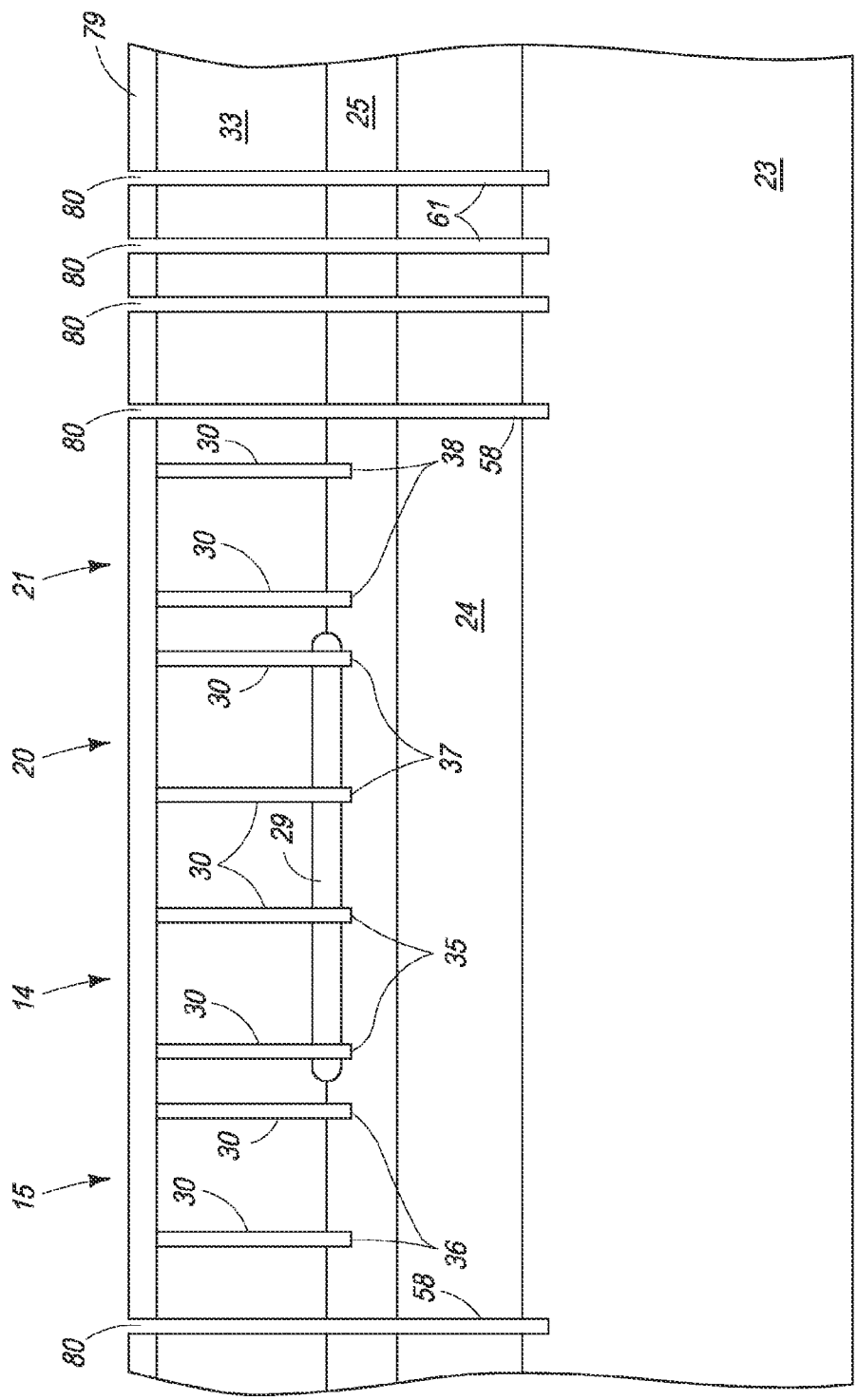

FIG. 3 through FIG. 5 illustrates various sequential stages of some of the steps in a preferred method of forming device 10. Referring to FIG. 3, in this preferred embodiment, but semiconductor substrate 23 has a P-type conductivity and generally has a doping concentration that is approximately $1 \times 10^{19}$ atoms/cm$^3$ and preferably is between approximately $1 \times 10^{19}$ and $1 \times 10^{21}$ atoms/cm$^3$. Isolation layer 24 preferably is formed on a surface of substrate 23 as an N-type epitaxial layer. Layer 25 is formed on the surface of layer 24 as a P-type epitaxial layer. A portion 75 of the surface of layer 25 where semiconductor region 29 is to be formed, is doped with a dopant that can form an N-type doped region on the surface of layer 25.

Referring to FIG. 4, after portion 75 is doped, layer 33 is formed on the surface of layer 25 as an N-type epitaxial layer. During the formation of layer 33, the dopants in portion 75 usually are activated to form doped semiconductor region 29 at the interface between layers 25 and 33. Region 29 may extend into both layers 33 and 25 or may be formed in other positions as long as region 29 forms a P-N junction such as with layer 33.

Subsequently, a plurality of blocking structures, such as isolation trenches 35, 36, 37, and 38 (FIG. 2), are formed in order to isolate the portion of layer 33 where each of diodes 14, 15, 20, and 21 are to be formed from each other. These blocking structures have a periphery, such as the periphery at the surface of layer 33 and extending vertically into layer 33, that surrounds each respective diode and prevents current from flowing from any of diodes 14, 15, 20, or 21 laterally through layer 33 and force any lateral current flow between these diodes to occur within layer 25. In order to form isolation trenches 35, 36, 37, and 38, a mask 76, such as a silicon dioxide or silicon nitride layer, is formed on layer 33 and patterned to form openings 77 where trenches 35, 36, 37, and 38 are to be formed. Openings 77 are used to form openings that extend through layer 33 and into layer 25. The openings for trenches 35 and 37 also extend through region 29 into layer 25 so that trenches 35 and 37 may reduce conduction laterally through region 29 between diodes 18 and 19 reduce conduction with either of diodes 15 or 21. Additionally, trenches 35 and 37 separate region 29 into separate regions that will form separate P-N junctions between region 29 and layer 25 thereby using region 29 to form two zener diodes 18 and 19. In some embodiments, a dielectric liner 30, such as silicon dioxide, may be formed along the sidewalls and bottoms of the openings for trenches 35, 36, 37, and 38. In other embodiments, the dielectric liner is removed (or not formed) along the bottom of the openings for trenches 35, 36, 37, and 38. Liner 30 assists in forming each of trenches 35, 36, 37, and 38 as an isolation trench. For clarity of the drawings, liner 30 is illustrated as a line along the sides of the openings.

FIG. 5 illustrates device 10 after subsequent steps in the method. After the openings for trenches 35, 36, 37, and 38 are formed, mask 76 usually (FIG. 4) is removed. Thereafter, the openings for trenches 35, 36, 37, and 38 are filled with a conductor, such as doped polysilicon, to form the openings into trenches 35, 36, 37, and 38. In some embodiments, it may be necessary to planarize the surface of layer 33 after forming the conductor material within the openings. Methods to form trenches 35, 36, 37, and 38 are well known to those skilled in the art. Because trenches 35 and 37 extend through region 29, they also reduce alignment tolerances and make it easier to reliably produce device 10. Each of trenches 35, 36, 37, and 38 preferably are formed as a multiply-connected domain, such as a circle or closed polygon, with a periphery that has an opening which encloses a portion of layer 33, thus, each of trenches 35, 36, 37, and 38 may be regarded as a multiply-connected domain. In the case of a polygon, the corners of the closed polygon preferably are rounded. Trenches 35, 36, 37, and 38 each surround the portion layer 33 where respective diodes 14, 15, 20, and 21 are to be formed. Each of trenches 35, 36, 37, and 38 may be viewed as a blocking structure that minimizes electrical coupling between the enclosed portions and other portions of device 10.

Referring to FIG. 2 and FIG. 5, conductor trenches or conductors 60 and a blocking structure, such as an isolation trench 57 (FIG. 2), subsequently may be formed. This blocking structure isolates diodes 14, 15, and 18-21 of device 10 from conductors 60 and from a doped region 63. This prevents lateral current flow from any of these diodes to conductors 60 (or to region 63) through any of layers 24, 25, and 33. As will be seen further hereinafter, trench 57 is used as an isolation trench that also prevents currents Ip and In from flowing laterally through layer 25 past the diodes where the currents are intended to flow through. Conductors 60 facilitate forming an electrical connection from the top surface of layer 33 to substrate 23. In order to form trench 57 and conductors 60, another mask 79 usually is applied and patterned to form openings 80 within mask 79 where trench 57 and conductors 60 are to be formed. Mask 79 usually is similar to mask 76. Openings 80 are used to form openings that extend from the surface of layer 33 though layer 33, layer 25, layer 24 and into substrate 23. A dielectric liner 58 is formed along the sidewalls, but not the bottom, of the opening for trench 57 to prevent trench 57 from electrically interacting with layers 24, 25, and 33. In some embodiments, liner 58 may also be formed in the bottom of the opening. A similar dielectric liner 61 is formed along the sidewalls, but not the bottoms, of the openings for conductors 60 to prevent conductors 60 from electrically interacting with layers 24, 25, and 33. Liner 61 is not formed in the bottom of the openings so that conductors 60 can electrically contact substrate 23. The number of conductors 60 is chosen to provide the desired resistivity of the electrical connection to substrate 23. Those skilled in the art will appreciate that liners 58 and 61 generally are formed by forming a dielectric, such as silicon dioxide, on the sidewalls and bottom, and the portion of the bottom may be removed with a separate step.

Referring again to FIG. 2, mask 79 may subsequently be removed and a conductor, such as doped polysilicon, is formed within the openings of trench 57 and conductors 60 to form the openings into trench 57 and conductors 60. If a doped semiconductor material is used for the conductor that is within trench 57 and conductors 60, the doped semiconductor material preferably is doped to be the same conductivity as substrate 23 in order to form an electrical connection thereto. However, other doping types may also be used. The surface of layer 33 may again have to be planarized after forming the conductor within the openings. Trench 57 is formed as a multiply-connected domain, such as a circle or closed polygon, with a periphery that encloses a portion of layers 33, 25, and 24 where diodes 14, 15, 18, 19, 20, and 20 are to be formed. In the case of a polygon, the corners preferably are rounded.

Subsequently, diodes 14, 15, 20, and 21 are formed such as by forming doped regions on the surface and extending into layer 33. Diode 14 includes a doped region 42 that is formed on the surface of layer 33 with a conductivity that is opposite to layer 33. Similarly, diode 20 includes a doped region 48 that is formed on the surface of layer 33 with a conductivity that is opposite to layer 33. Diodes 14 and 20 are formed by the P-N junction between layer 33 and respective regions 42 and 48. Regions 42 and 48 are formed to extend into layer 33 and overlie region 29 so that regions 42 and 48, thus diodes 14 and 20, are electrically connected to separate portions of region 29 to form electrical connections to diodes 18 and 19. Regions 42 and 48 usually are positioned so that the periphery of each of regions 42 and 48, such as a periphery formed at the surface of layer 33, is completely surrounded by respective trenches 35 and 37. Preferably, each of trenches 35 and 37 are one continuous trench that is formed around respective regions 42 and 48. Because trenches 35 and 37 extend through layer 33, they reduce the amount of layer 33 that is near regions 42 and 48 thereby assisting in reducing the capacitance of diodes 14 and 20. Trenches 35 and 37 also reduce interaction between diodes 14 and 20.

Diodes 15 and 21 are each formed by the P-N junction at the interface of layer 33 and layer 25 and within the regions surrounded by respective trenches 36 and 38. A doped region 49 is formed in layer 33, and surrounded by trench 38, with a conductivity that is the same as layer 33 in order to form a contact region for electrically contacting the portion of layer 33 where diode 21 is formed. Similarly, a doped region 41 is formed in layer 33, and surrounded by trench 36, with a conductivity that is the same as layer 33 in order to form a contact region for electrically contacting the portion of layer 33 where diode 15 is formed. Regions 41 and 49 are formed on the surface of layer 33 and preferably extend approximately the same distance into layer 33 as regions 42 and 48. However, regions 41 and 49 do not overlie region 29. Region 41 is positioned so that the periphery of region 41, such as the periphery at the surface of layer 33, is completely surrounded by trench 36 and region 49 is positioned so that the periphery of region 49, such as the periphery at the surface of layer 33, is completely surrounded by trench 38. Each of trenches 37 and 38 preferably are formed as one continuous trench.

Another doped region 63 is formed on the surface of layer 33 to overlie and preferably abut conductors 60 in order to form an electrical connection to conductor trenches 60. Region 63 is formed with the same conductivity as substrate 23 so that region 63 forms a conduction path through trenches 60 to substrate 23. Preferably, the top of the openings for conductor trenches 60 has the dielectric liner removed from the portion of conductors 60 that is within region 63 to facilitate forming a low resistance electrical connection therebetween. Regions 42, 48, and 63 may be formed together at the same time. Regions 41 and 49 may be formed together at the same time. As can be seen from FIG. 2, diode 85 is formed by substrate 23 and layer 24 and the interface therebetween, an diode 87 is formed by substrate 23 and layer 24 and the interface therebetween.

Subsequently, a dielectric 51 may be formed on the surface of layer 33. Openings generally are formed through dielectric 51 to expose portions of regions 41, 42, 48, 49, and 63. A conductor 52 usually is applied to make electrical contact to both regions 41 and 42. A conductor 53 generally is applied to make electrical contact to both regions 48, 49, and 63. Those skilled in the art will appreciate that region 63 may be omitted and conductor 52 may directly contact the conductor material that is within conductors 60. Conductors 52 and 53 usually are subsequently connected to respective terminals 11 and 12. Since the ESD current flow of device 10 is not through the bottom surface of substrate 23, a conductor generally is not applied thereto. Consequently, device 10 has two terminals that generally are connected to two terminals of a semiconductor package to form a single ESD device. In other embodiments, terminals 11 and 12 of device 10 may be connected to other devices, such as in a multiple die semiconductor package, to form a different device.

Referring back to FIG. 1 and FIG. 2, when device 10 receives a positive ESD voltage on terminal 11 relative to terminal 12, diodes 14, 18, and 21 are forward biased and diodes 15, 19, and 20 are reverse biased. As a result, current Ip begins to flow from terminal 11 to the anode of diode 14 at region 42, through the P-N junction of diode 14 at the interface between region 42 and layer 33, and to the cathode of diode 14 in the portion of layer 33 that is surrounded by trench 35. Current Ip continues on through layer 33 and to the cathode of diode 18 at region 29, and through the P-N junction of diode 18 that is formed at the interface of the portion of region 29 that is surrounded by trench 35 and the abutting portion of layer 25. Since this abutting portion of layer 25 forms the cathode of diode 18, current Ip flows into layer 25. Since substrate 23 as biased through conductors 60, substrate 23 forms a reverse biased P-N junction at the interface between layer 25 and layer 24 which prevents current Ip from flowing into both layer 24 and substrate 23. Also, trench 57 constrains current Ip to remain within the portion of layer 25 that is surrounded by trench 57. Consequently, current Ip flows through layer 25 to the cathode of diode 21 that is formed by the portion of layer 25 that abuts with the portion of layer 33 that is surrounded by trench 38. Current Ip flows through the P-N junction of diode 21 at the interface of layer 25 and layer 33 that is surrounded by trench 38 and continues on to the anode of diode 21 that is formed by layer 33. Current Ip continues through layer 33 to region 49 and terminal 12. It can be seen that layer 24 forms an isolation layer that prevents current Ip from flowing to substrate 23 and that layer 25 forms a conductor layer that conducts current between diodes 18 and 21. Thus, layer 25 electrically connects the anode of diode 18 to the anode of diode 21 and layer 33 connects the cathode of diode 14 to the cathode of diode 18.

Figure 6:
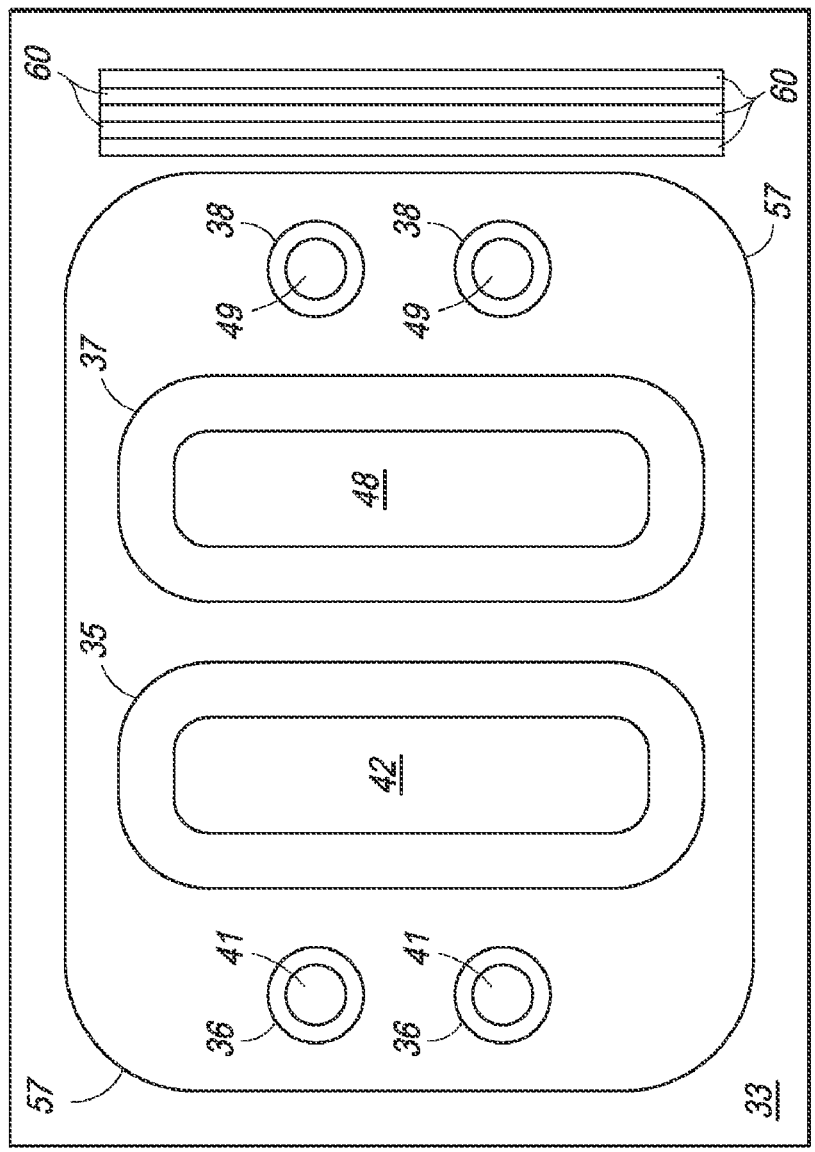
FIG. 6 is an enlarged plan view of a portion of an embodiment of the ESD device of FIG. 1 through FIG. 5 in accordance with the present invention.

FIG. 6 is an enlarged plan view of a portion of an embodiment of device 10. FIG. 6 illustrates device 10 without dielectric 51 and conductors 52 and 53 so that the surface of layer 33 is illustrated. For the embodiment of FIG. 6, device 10 includes two diodes 15 and two diodes 21. The plan view illustrates the multiply-connected domain configuration trenches 35, 36, 37, 38, and 57. For example, trenches 35, 37, and 57 are formed as closed polygons with rounded corners, and trenches 36 and 38 are formed as circles. Conductors 60 illustrates that conductors 60 are not formed into a closed polygon, but are formed at one end of the structure of device 10 in order to form contact to substrate 23. Typically, conductors 60 are formed close to diodes 20 and 21 in order to facilitate forming conductor 53 to electrically contact all of conductors 60 and diodes 20 and 21.

When device 10 receives a negative voltage on terminal 11 relative to terminal 12, diodes 20, 19, and 15 are forward biased and diodes 14, 18, and 21 are reverse biased. As a result, current In begins to flow from terminal 12 to the anode of diode 20 at region 48, through the P-N junction of diode 20 at the interface between region 48 and layer 33, and to the cathode of diode 20 in the portion of layer 33 that is surrounded by trench 37. Current In continues on through layer 33 and to the cathode of diode 19 at region 29, and through the P-N junction of diode 19 that is formed at the interface of the portion of region 29 that is surrounded by trench 37 and the abutting portion of layer 25. Since this abutting portion of layer 25 forms the cathode of diode 19, current In flows into layer 25. Substrate 23 is again biased through conductors 60 and forms a reverse biased P-N junction at the interface between layer 25 and layer 24 which prevents current In from flowing into both layer 24 and substrate 23. Also, trench 57 constrains current In to remain within the portion of layer 25 that is surrounded by trench 57. Consequently, current In flows through layer 25 to the cathode of diode 15 that is formed by the portion of layer 25 that abuts with the portion of layer 33 that is surrounded by trench 36. Current In flows through the P-N junction of diode 15 at the interface of layer 25 and the portion of layer 33 that is surrounded by trench 36 and continues on to the anode of diode 15 that is formed by layer 33. Current In continues through layer 33 to region 41 and terminal 11. Layer 24 forms the isolation layer that prevents current In from flowing to substrate 23 and layer 25 forms a conductor layer that conducts current In between diodes 20 and 15. Thus, layer 25 electrically connects the anode of diode 15 to the anode of diode 19 and layer 33 connects the cathode of diode 20 to the cathode of diode 19. Note that for both the positive and negative 550 discharge events, the ESD current flow is into and out of the top surface of layers 25 and 33. The ESD current does not flow through or even into substrate 23. Additionally, it can be seen that trench 57 confines current Ip and In to flow through the portion of layer 25 that is surrounded by trench 57. Additionally, trench 57 prevents forming a short from region 63 through layer 33 to layer 24. Such a short would short terminal 12 to the anode of diodes 21 and 19.

The sheet rho, or Gummel number, of layer 24 is controlled by the carrier concentration within layer 24 and the thickness of layer 24. The sheet rho of layer 24 relative to the sheet rho of layer 25 is controlled to assist in preventing the enablement of a parasitic bipolar transistor that may be formed by layers 25, 24, and substrate 23. Preferably, the carrier concentration of layer 24 is between about 1E15 atoms/cm$^3$ and 1E17 atoms/cm$^3$ with a thickness of about two to twenty (2-20) microns. In one example embodiment, layer 25 is formed with a thickness of about two to ten (2-10) microns and a doping concentration of about 1E19 atoms/cm$^3$ in order to facilitate efficient carrier conduction between diodes 18 and 21. Because of these doping relationships, diodes 85 and 87 generally do not conduct current in this embodiment of device 10.

Figure 7:
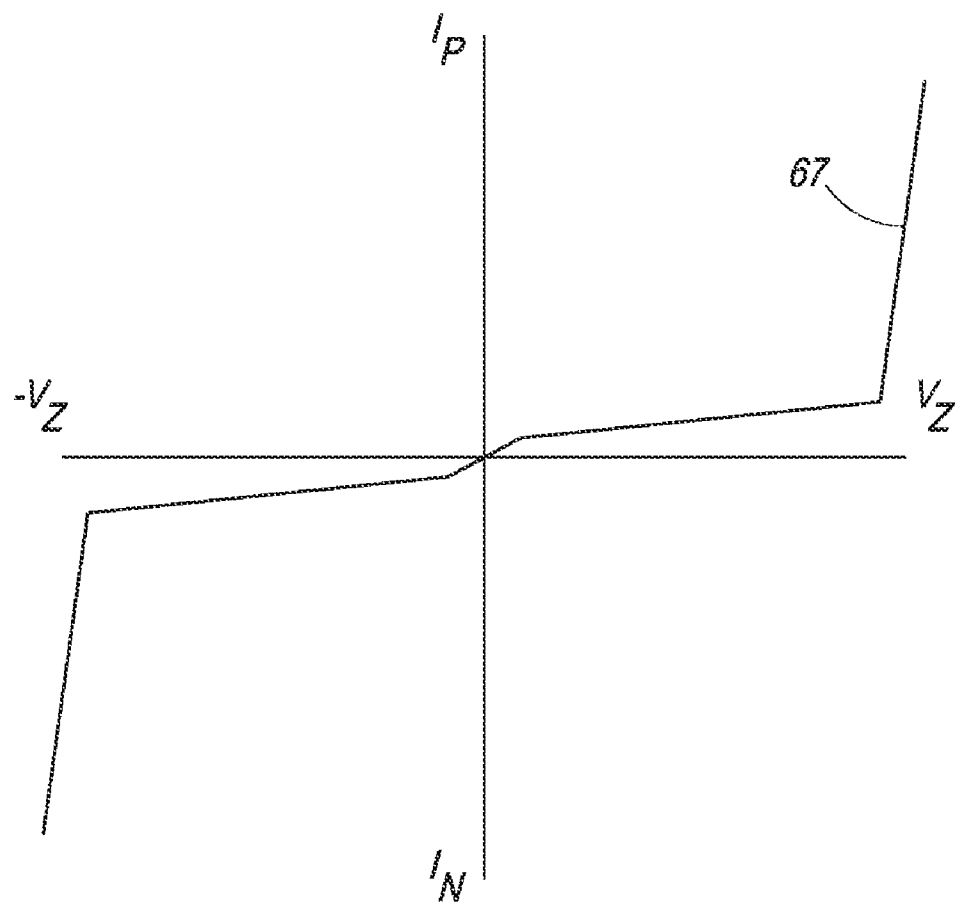
FIG. 7 is a graph illustrating the V-I characteristics of the ESD device of FIG. 1 through FIG. 6 in accordance with the present invention.

FIG. 7 is a graph that illustrates the V-I characteristics of device 10. The abscissa indicates the voltage applied to terminal 11 relative to terminal 12, and the ordinate indicates the current through device 10. A plot 67 illustrates the V-I characteristic. Because layer 24 is formed to prevent enabling the parasitic bipolar transistor between substrate 23 and layers 24 and 25, the V-I characteristic for device 10 has a sharp knee and is substantially symmetrical for both positive and negative ESD discharge events as illustrate by plot 68.

Additionally, the structure or device 10 is formed to have a low capacitance. This low capacitance when device 10 is not conducting allows fast data transmission over the data transmission lines to which device 10 is attached without the capacitance of device 10 interfering therewith. In normal operation, device 10 is biased to a normal operating voltage, such as a voltage that is between about one volt (1V) and the zener voltage of diodes 18 or 19, such as by applying about one volt (1V) to terminal 11 and a ground reference voltage to terminal 12. Because of the hereinafter described characteristics of device 10, the capacitance of device 10 remains low as the voltage between terminals 11 and 12 varies over this normal operating voltage. However, the capacitance of an ESD device is customarily specified with zero volts applied across the device. This zero voltage condition is normally referred to as a zero bias condition. As will be seen further hereinafter, at this zero bias condition the hereinafter described low capacitance features of device 10 forms very low capacitance values for diodes 14, 15, 20, and 21. Since there are two parallel paths between terminals 11 and 12, the capacitance value of each path is the additive product of the capacitances in each path. The first path includes the capacitances or diodes 14, 18 and 21 in series. Since the capacitance of capacitors in series is smaller than that of the smallest capacitor, then the capacitance of the first path is smaller than the capacitance of either of diodes 14, 18, or 21. Device 10 is formed so that the zero bias capacitance of diodes 14 and 21 are very small as will be seen further hereinafter. Similarly, the capacitance of the second path, that includes diodes 20, 19 and 15, is also very small. The overall additive value of the two paths forms a small zero bias capacitance for device 10.

Figure 8:
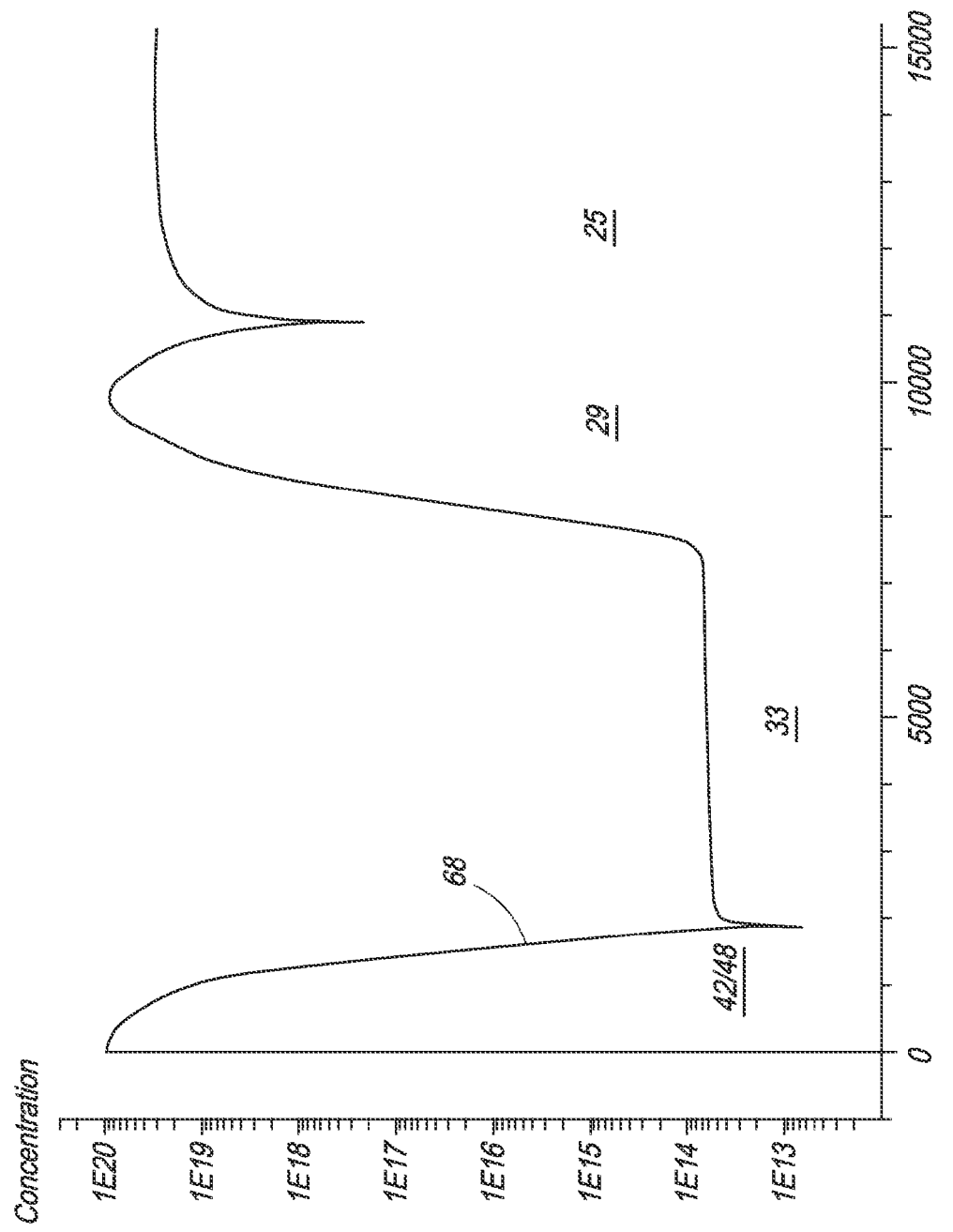
FIG. 8 is a graph illustrating some of the carrier concentrations of the ESD device of FIG. 1 through FIG. 7 in accordance with the present invention.

FIG. 8 is a graph illustrating the carrier concentration profile of a portion of one exemplary embodiment of device 10. The abscissa indicates depth from the surface of layer 33 into device 10 and the ordinate indicates increasing value of the carrier concentration. A plot 68 illustrates the carrier concentration of device 10 that results from a positive bias applied from terminal 11 to terminal 12 (such as by a positive ESD event). This description has references to FIG. 1, FIG. 2, and FIG. 7. In order to assist in forming device 10 to have a sharp knee, the preferred embodiment of layer 25 is formed with a P-type conductivity and generally has a doping concentration that is approximately $1 \times 10^{19}$ atoms/cm$^3$ and preferably is between approximately $1 \times 10^{19}$ and $1 \times 10^{21}$ atoms/cm$^3$. Semiconductor region 29 is formed as an N-type region having a peak doping concentration of approximately $1 \times 10^{19}$ atoms/cm$^3$ and preferably is between approximately $1 \times 10^{19}$ and $1 \times 10^{21}$ atoms/cm$^3$ for a clamp voltage of approximately two to ten volts (2-10 V). In order to assist in forming the low zero bias capacitance for device 10, the preferred embodiment of layer 24 (FIG. 2) is formed with a n-type conductivity and generally has a doping concentration that is approximately $1 \times 10^{16}$ atoms/cm$^3$ and preferably is between approximately $1 \times 10^{15}$ and $1 \times 10^{17}$ atoms/cm$^3$. Additionally, the thickness of region 29 preferably is between about one and three (1-3) microns. Because of the high doping concentration of region 29 and layer 25, when device 10 receives a positive voltage from terminal 11 to terminal 12, the depletion region is confined to a small area within region 29 and layer 25 near to the interface with layer 25. This high concentration of carriers and dopants provides zener diodes 18 and 19 with a very sharp transition or knee and allows very accurate control over the breakdown voltage or zener voltage of diodes 18 and 19. The breakdown voltage or zener voltage of diodes 18 and 19 can be adjusted by changing the carrier concentration or carrier profile of region 29 and/or of layer 25. This allows precisely controlling the breakdown voltage for specific applications such as for five or twelve or twenty-four volt (5V, 12V, 24V) breakdown voltage application.

Layer 33 preferably is formed to have a lower peak doping concentration that is at least one order of magnitude less than the doping concentration of region 29 and generally is between about 1E13 and 1E17 atoms/cm$^3$.

The peak doping concentration of regions 42 and 48 generally is greater than the peak doping concentration of layer 33 and preferably is approximately equal to the peak doping concentration of layer 25. Regions 42 and 48 generally are formed to extend a distance no greater than about two (2) microns and preferably about one tenth to two (0.1-2) microns from the surface into layer 33. The large differential doping concentration between region 42 and layer 33 and also between region 48 and layer 33 and the shallow depth of regions 42 and 48 assists in providing respective diodes 14 and 20 with a very small zero bias capacitance. This very small zero bias capacitance of diodes 14 and 20 assists in forming a small zero bias capacitance for device 10 as indicated hereinbefore. The capacitance of each of diodes 14, 18, and 21 at zero bias generally is less than about 0.5 pico-farads and the equivalent series capacitance of diodes 14, 18, 20, and 21 forms a capacitance for device 10 that is about 0.2 pico-farads and preferably is no greater than about 0.01 pico-farads.

Because trenches 36 and 38 extend through layer 33, they reduce the area of the P-N junctions formed between the portions of layers 25 and 33 that underlie respective regions 41 and 49 thereby assisting in reducing the capacitance of respective diodes 15 and 21. In the preferred embodiment, regions 41 and 49 have a peak doping concentration that is greater than the peak doping concentration of layer 33 and preferably is approximately equal to the peak doping concentration of layer 29.

Regions 42 and 48 generally are separated from region 29 by a distance that assists in minimizing the capacitance of diodes 15 and 21. The spacing generally is approximately two to twenty (2-20) microns. The portion of layer 33 that is between regions 42 and 29 and between regions 48 and 29 forms a drift region of respective diodes 14 and 20. The thickness or the drift region of layer 33 generally is at least around two microns in order to reduce the formation of parasitic transistors and to ensure that device 10 does not operate in a punch-through operating region. As can be seen, device 10 usually is devoid of a doped region having a conductivity that is the same as layer 25 and that is positioned between diode 14 and region 29, thus between regions 42 and 29.

The capacitance of device 10 at zero bias generally is less than about 0.5 picofarads and the equivalent series capacitance for device 10 is about 0.3 picofarads and preferably is no greater than about 0.1 picofarads.

When device 10 receives a positive voltage on terminal 11 relative to terminal 12, diodes 20 and 15 are reverse biased and diodes 14 and 21 are forward biased. Because of the depletion regions formed by the reverse biasing, the carrier density in layer 33 is further reduced from the zero bias condition which assists in further reducing the equivalent series capacitance of device 10. This allows the capacitance to be low even with increasing bias voltage. In fact, unlike single diodes, device 10 has a substantially constant capacitance. Due to the symmetry of device 10, the capacitance is constant for both positive and negative voltage applied between terminals 11 and 12. This flat capacitance profile persists for voltages lower than the zener voltage of device 10. As a contrast, a single diode has low capacitance under reverse bias, relative high capacitance at zero volts, and quadratically increasing capacitance with forward bias.

When an electrode-static discharge occurs, there is generally a large voltage, and current spike that occurs over a brief period of time. Generally, the peak current and peak voltage occurs over a period of a few nanoseconds, typically less than two nanoseconds (2 nsec.) and could last for only about one nanosecond (1 nsec.). The current generally decreases to a plateau for another time interval usually around twenty (20) nanoseconds and slowly decreases over another twenty to forty (20-40) nanoseconds. The peak value of the current could be between one to thirty amperes (1 to 30 amps) and the peak voltage could be between two thousand and thirty thousand volts (2000-30000 V). The size and response time of the elements of device 10 preferably are configured to respond to the voltage during the time interval of the peak voltage and conduct the peak current. During an ESD event between terminals 11 and 12, either of diodes 14 and 21 is connected in series and diodes 15 and 20 are connected in series, the effective capacitance is the total series capacitance. Because capacitors in series result in a capacitance that is less than the smallest capacitance, the low capacitance ensures that the capacitance of device 10 is low enough for device 10 to respond to the ESD event and conduct the ESD current during the peak ESD voltage and current.

Figure 9:
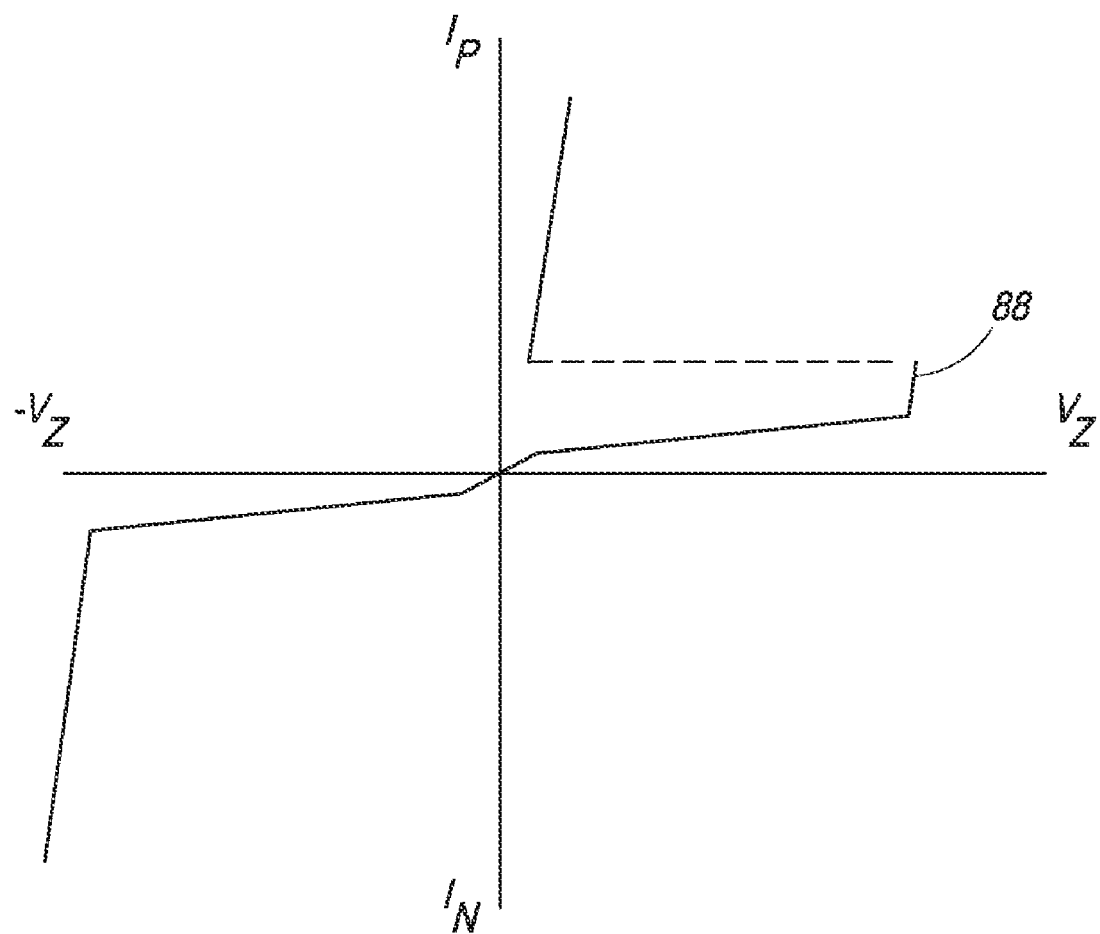
FIG. 9 is a graph illustrating the V-I characteristics of an alternate embodiment of the ESD device of FIG. 1-FIG. 8 in accordance with the present invention.

FIG. 9 is a graph that illustrates the current-voltage (I-V) characteristics of an alternate embodiment of device 10. The abscissa indicates the voltage applied to terminal 12 relative to terminal 11, and the ordinate indicates the current through the alternate embodiment of device 10. A plot 88 illustrates the I-V characteristic. In this alternate embodiment of device 10 the sheet rho of layer 24 is increased in order to facilitate enabling the parasitic bipolar transistor that can be formed between substrate 23 and layers 25 and 24. Allowing the parasitic bipolar transistor to be enabled forms a current flow path from layer 25 to substrate 23 and allows current to flow from terminal 12 to the anode of diodes 15 and 21. Enabling the parasitic bipolar transistor changes the V-I characteristics and forms this alternate embodiment device 10 to have a snap-back and to function similarly to a thyristor. Note that with this doping concentration for layer 24, as the voltage difference between terminals 11 and 12 increases, the parasitic bipolar transistor becomes enabled and shorts layer 25 to substrate 23 thereby allowing current to flow from layer 25 to substrate 23 and through conductors 60 to terminal 12 resulting in the snap-back characteristic.

In certain applications, it may be beneficial to be capable of withstanding a large surge current. Because of the snap-back characteristic, device 85 will provide both high current surge through the bipolar transistor and ESD protection. Note that this parasitic bipolar transistor is formed on the side of terminal 12 which is shorted to substrate 23 by conductive trenches 60. Thus, this alternate embodiment of device 10 is asymmetrical because the snap-back is only on the positive side of the current-voltage characteristics with terminal 12 designated as the anode. The cathode side is still blocking in this configuration.

Figure 10:
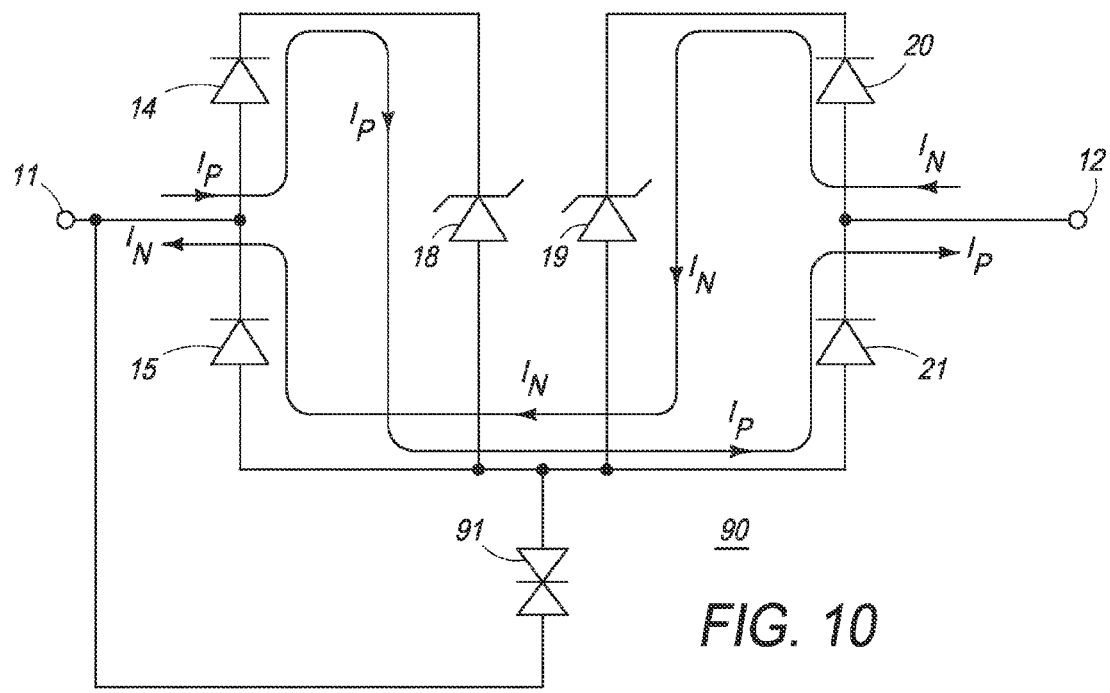
FIG. 10 schematically illustrates an embodiment of a portion of a circuit representation of still another electro-static discharge (ESD) protection device that is an alternate embodiment of the ESD device of FIG. 1-FIG. 8 in accordance with the present invention.

FIG. 10 schematically illustrates an embodiment of a portion of an electrostatic discharge (ESD) protection device or ESL) device 90 that is another alternate embodiment of device 10 that was described in FIG. 1-FIG. 9. Device 90 is similar to device 10 except that the sheet rho of either layer 29 or layer 33 is greater in order to increase the gain in the base region formed by layers 29 and 33 and facilitate enabling another parasitic bipolar transistor that can be formed between region 42, layer 33 (along with region 29), and layer 25. Enabling this parasitic bipolar transistor changes the V-I characteristics and forms device 90 to have a snap-back between zener diode 18 and diode 14 causing device 10 to function similarly to a thyristor. Additionally, diode 91 is similar to diode 85 except that diode 91 is connected to terminal 11 instead of terminal 12.

Figure 11:
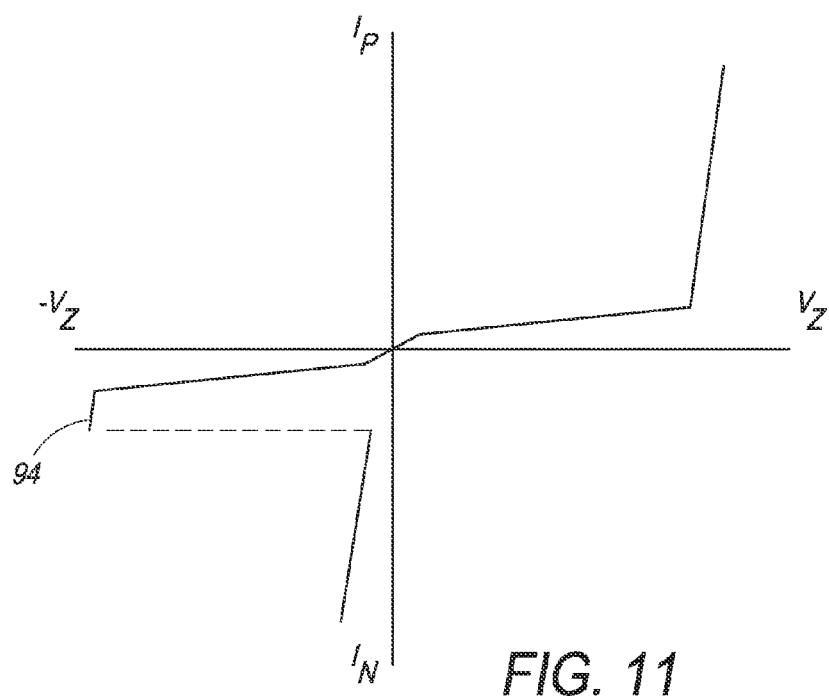
FIG. 11 is a graph illustrating the V-I characteristics of the ESD device of FIG. 10 in accordance with the present invention.

FIG. 11 is a graph that illustrates the current-voltage I-V characteristics of device 90. The abscissa indicates the voltage applied to terminal 12 relative to terminal 11, and the ordinate indicates the current through device 85. A plot 94 illustrates the I-V characteristic. Note that with this doping concentration for layer 33, as the voltage difference between terminals 11 and 12 increases, the parasitic bipolar transistor becomes enabled and shorts layer 33 to layer 24, thus, to substrate 23 thereby allowing current to flow from terminal 12 through conductors 60 to substrate 23 then through layers 25 and 24 to layer 33 and terminal 11. As can be seen from plot 94, device 90 is a symmetrical device and has a snap-back on both sides of the I-V characteristic.

Those skilled in the art will appreciate that both layers 4 and 33, and layers 24 and 29 may be doped to enable both of the parasitic bipolar transistors. This forms a symmetrical bi-directional device with snap-back characteristics for both current directions similar to a hi-directional thyristor.

Figure 12:
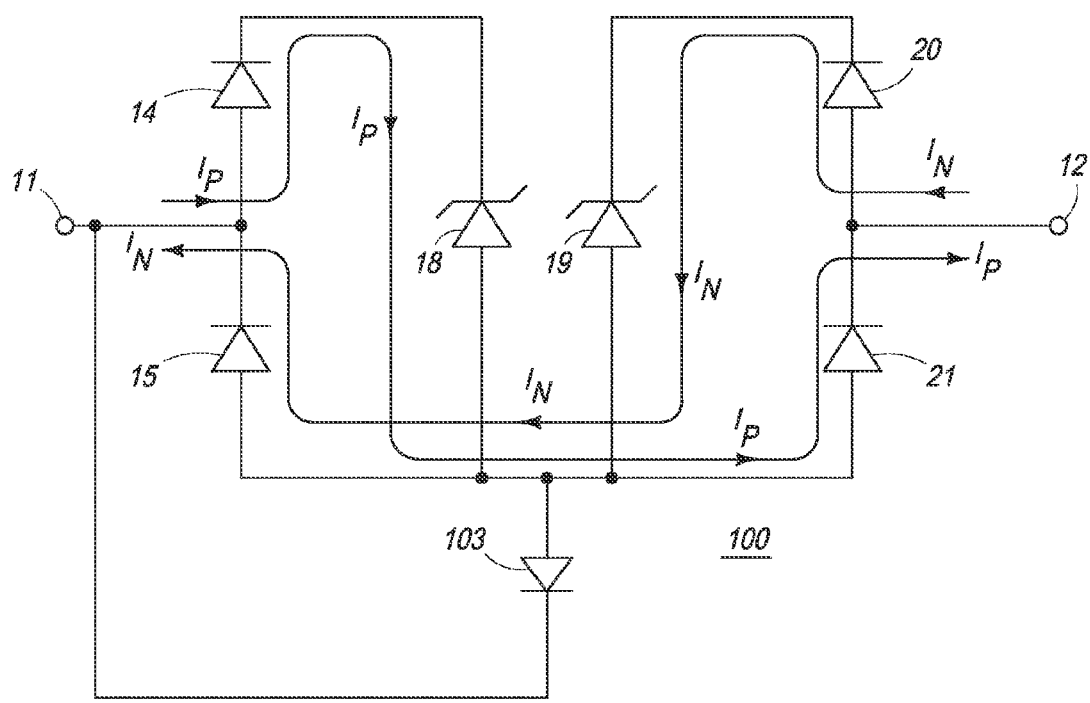
FIG. 12 schematically illustrates an embodiment of a portion of a circuit representation of another electro-static discharge (ESD) protection device in accordance with the present invention.

FIG. 12 schematically illustrates an embodiment of a portion of an electrostatic discharge (ESD) protection device or ESD device 100 that is alternate embodiment of either of devices 10 or 90 that were described in the explanation of FIGS. 9-11. Device 100 is similar to devices 10 and 90 except that device 100 has a single diode 103 instead of back-to-back diodes 85, 87 and 91 of respective devices 10 and 90. Configuring device 100 to have diode 103 coupled in parallel with diode 15 and in parallel with diode 21 improves the symmetry of the V-I characteristic curve of device 100.

Figure 13:
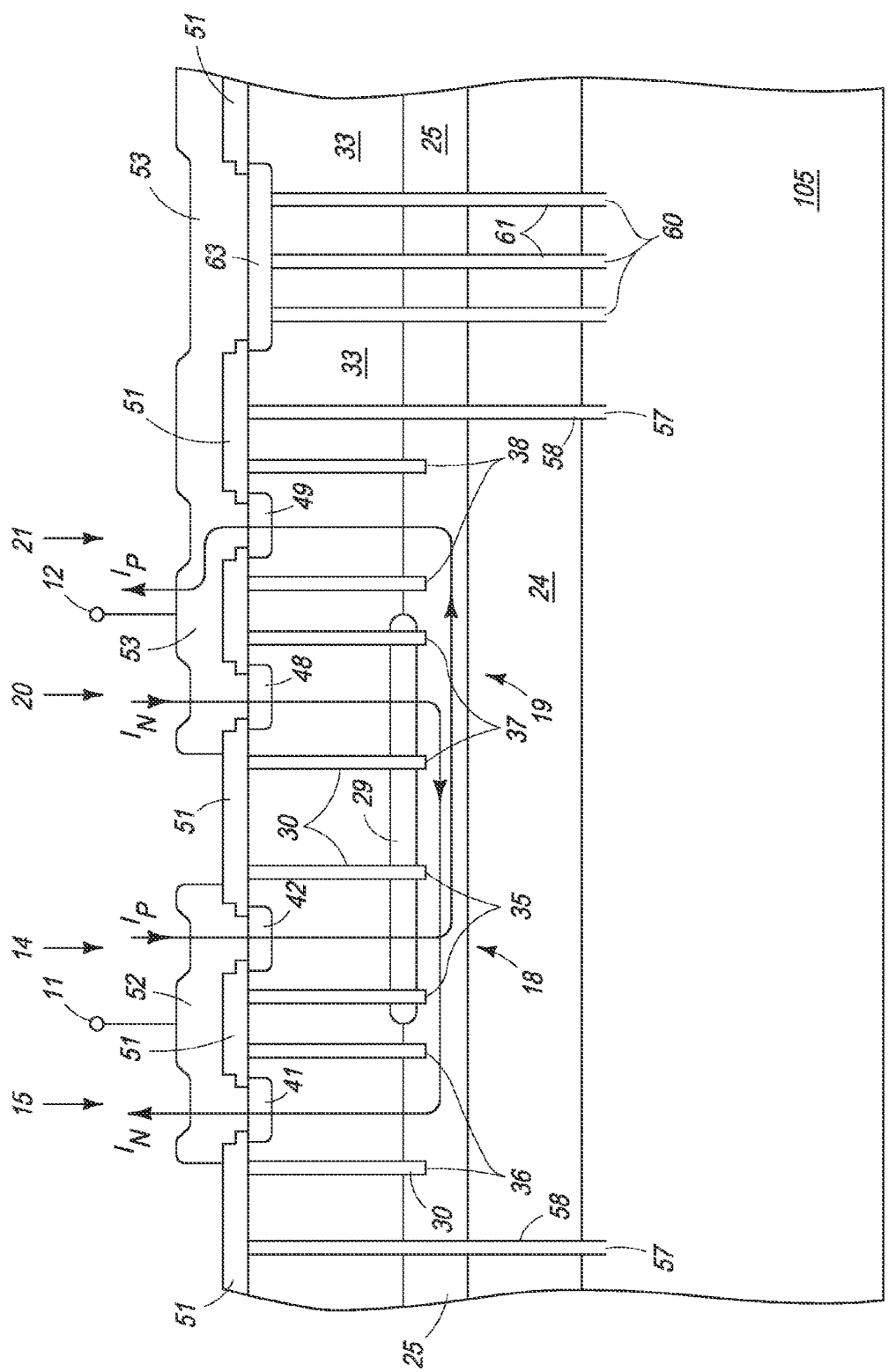
FIG. 13 illustrates a cross-sectional portion of an embodiment of the ESD device of FIG. 12 in accordance with the present invention.

FIG. 13 illustrates a cross-sectional view of a portion of an embodiment of ESD device 100. Device 100 is similar to devices 10 and 90 except that device 100 has a substrate 105 that has a doping type that is the same as layer 24. Thus, in the preferred embodiment, substrate 105 and layer 24 are both. N-type. Because both substrate 105 and layer 24 are the same doping type, there is no P-N junction between substrate 105 and layer 24, thus diode 103 is a single diode formed by the P-N junction between layer 24 and layer 25. The doping concentration of substrate 105 is substantially the same as the doping concentration of substrate 23. Forming device 100 with single diode 103 improves the symmetry of device 100.

Figure 14:
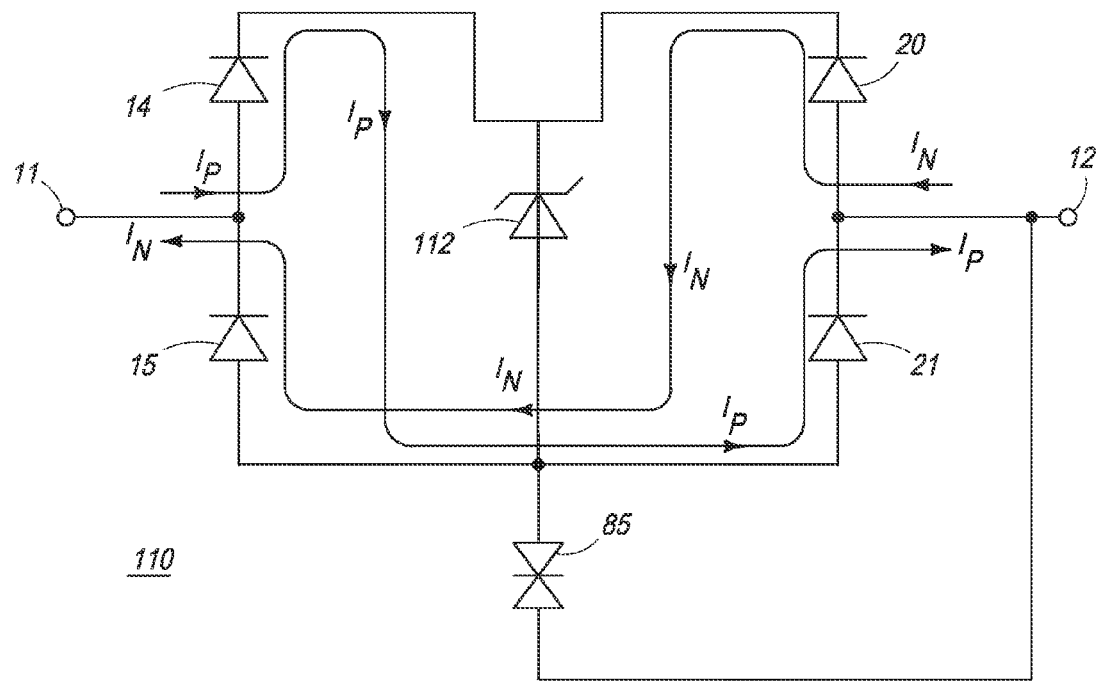
FIG. 14 schematically illustrates an embodiment of a portion of a circuit representation of another electro-static discharge (ESD) protection device in accordance with the present invention.

FIG. 14 schematically illustrates an embodiment of a portion of an electrostatic discharge (ESD) protection device or ESD device 110 that is an alternate embodiment of any of devices 10, 90, or 100. Device 110 is similar to any of devices 10, 90, or 100 except that device 110 has a single zener diode 112 instead of two zener diodes 18 and 19. Diode 112 has a cathode coupled to the cathode of diodes 14 and 20, and also has an anode coupled to the anode of diodes 15 and 21. Similarly to devices 10, 90, and 100, device 110 typically has low-capacitance, fast response time, and a symmetrical response characteristic.

Figure 15:
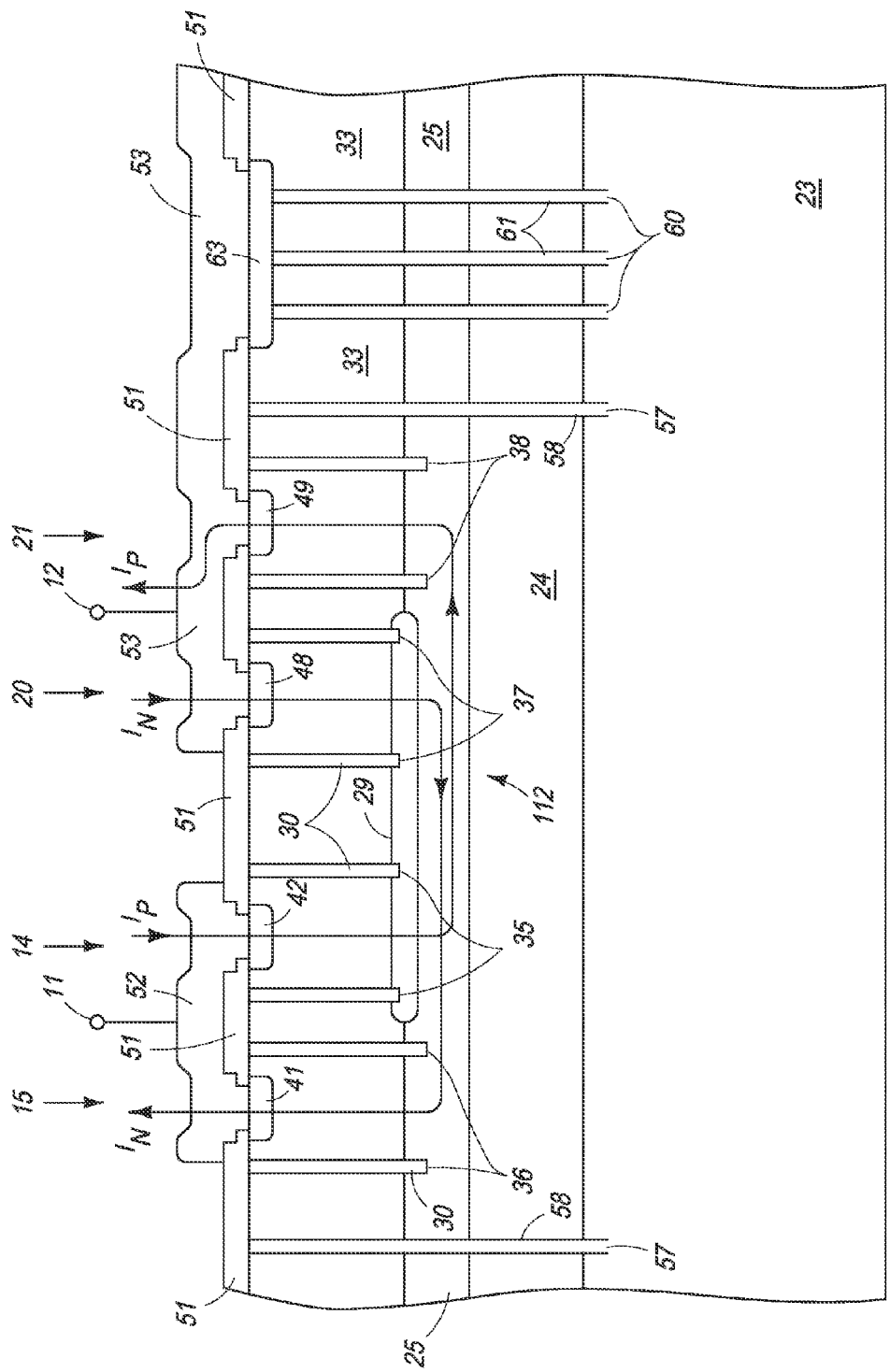
FIG. 15 illustrates a cross-sectional portion of an embodiment of the ESD device of FIG. 14 in accordance with the present invention.

FIG. 15 illustrates a cross-sectional portion of an example of an embodiment of device 110. Device 110 may be formed similarly to any of devices 10, 90, or 100 except that some of the blocking structures, for example trenches 35 and 37, are formed to extend into but not through semiconductor region 29. Forming the blocking structures to not extend through region 29 allows region 29 to form one zener diode 112 that has an anode commonly connected to the anode of diodes 15 and 21 through conductor layer 25, and also reduces crosstalk between diodes 15 and 21 to diodes 14 and 20. Those skilled in the art, will appreciate that in some embodiments, the outermost blocking structures, for example trenches 57, may be omitted, and that conductors 60 and region 63 also may be omitted. It will also be appreciated by those skilled in the art that the shorter depth of the blocking structures of device 110 may also be used for any of devices 10, 90, and 100. In some embodiments, trenches 36 and 38 may be formed with a depth that is similar to the depth that prevents trenches 35 and 37 from extending through region 29. Such an embodiment can provide a simpler process and reduce manufacturing costs. Those skilled in the art will appreciate that the device and methods explained in the description of FIGS. 14 and 15 may be applied to devices 10 and 103.

Figure 16:
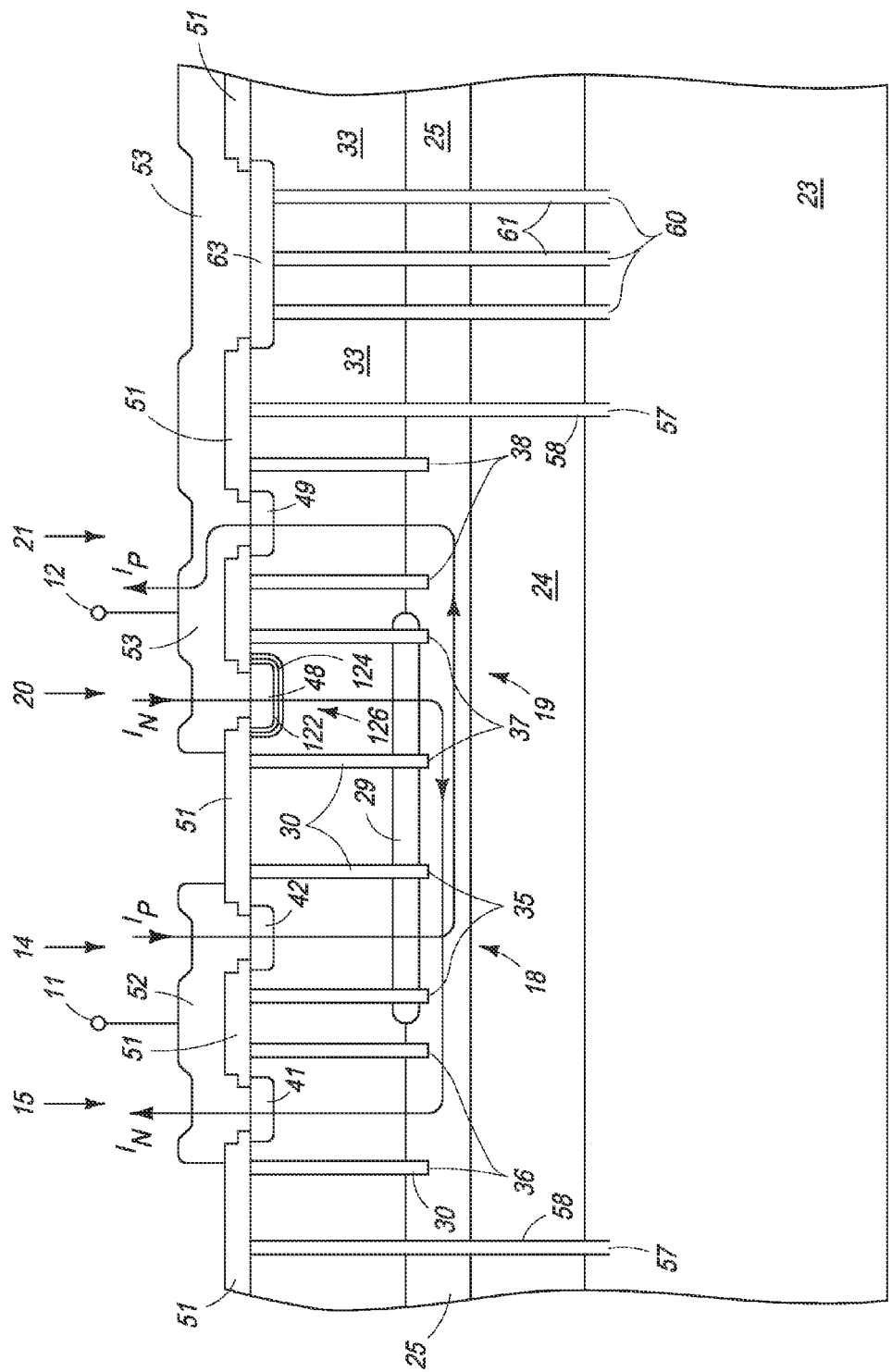
FIG. 16 illustrates a cross-sectional portion of an asymmetrical electro-static discharge (ESD) protection device that is an alternate embodiment of the ESD device of FIGS. 14 and 15 in accordance with the present invention.

FIG. 16 illustrates a cross-sectional portion of an example of an embodiment or an asymmetrical ESD device 120 that is an alternate embodiment of device 110 that is described in the description of FIGS. 14 and 15.

Figure 17:
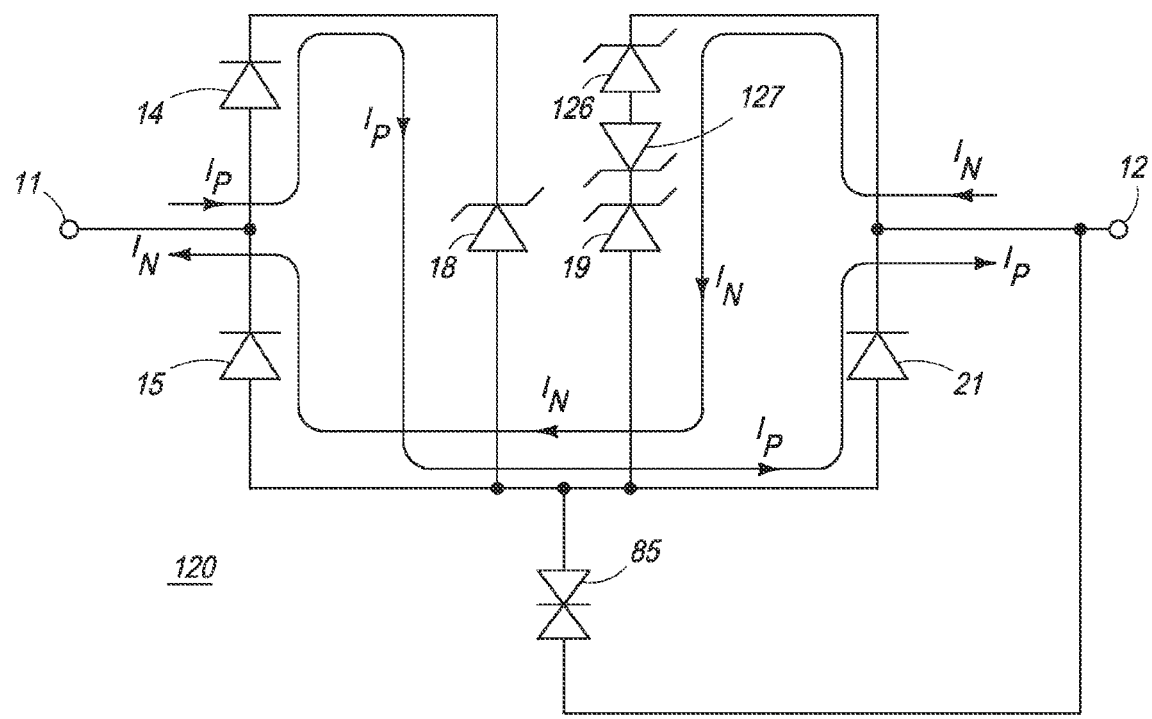
FIG. 17 schematically illustrates an embodiment of a portion of a circuit representation of the ESD protection device of FIG. 16 in accordance with the present invention.

FIG. 17 schematically illustrates an embodiment of a portion of a circuit representation of device 120. This description has references to FIG. 16 and FIG. 17. Device 120 omits diode 20 and includes doped regions 122 and 124 that are used to form two additional zener diodes 126 and 127. Diodes 126 and 127 are formed in a back-to-back configuration with a cathode of diode 127 connected to the cathode of diode 19. Diode 127 also has an anode connected to an anode of diode 126, and diode 126 has a cathode connected to terminal 12. Region 124 may be formed, prior to forming region 48, as an N-type doped region that has a doping concentration similar to the doping concentration of region 29. Doped region 122 usually is formed within region 124 as a P-type region having a doping concentration that is also similar to the doping concentration of region 29. Thereafter, region 48 may be formed within region 122. Those skilled in the art will appreciate that diodes 126 and 127 may also be connected with back-to-back cathodes instead of back-to-back anodes. The large differential doping concentrations of regions 122, 124, and layer 33 assist in forming the zener characteristics of diodes 126 and 127.

Figure 18:
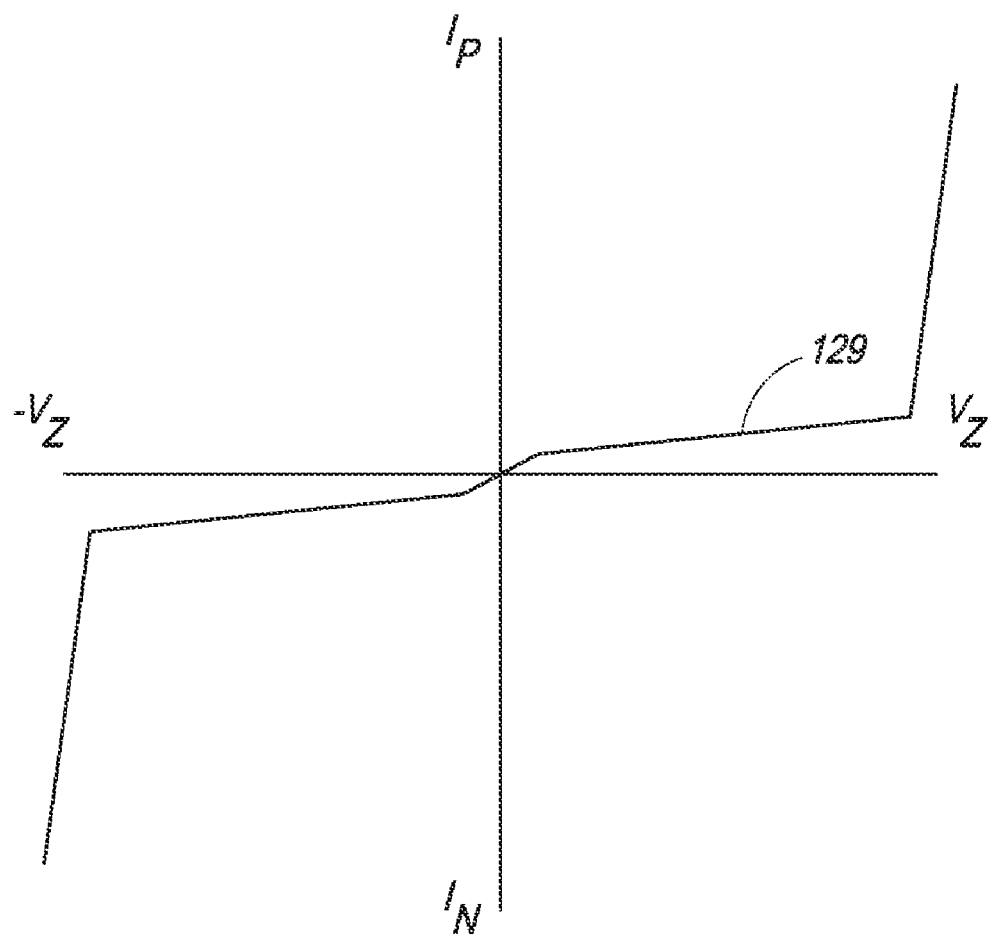
FIG. 18 is a graph illustrating the V-I characteristics of the ESD device of FIGS. 16 and 17 in accordance with the present invention.

FIG. 18 is a graph illustrating the V-I characteristics of device 120. A plot 129 illustrates the V-I characteristics. Forming diodes 126 and 127 in series between diodes 19 and 20 causes device 120 to have a higher breakdown voltage for positive ESD events than for negative ESD events. This characteristic is illustrated in FIG. 18. Diodes 126 and 127 provide device 120 with an asymmetrical breakdown which provides a higher breakdown voltage for a positive ESD event when terminal 12 has a higher voltage that terminal 11. Those skilled in the art will appreciate that regions 122 and 124 alternately may be formed around region 41 instead of region 49 so that diodes 126 and 127 may be connected in series between diodes 14 and 18 instead of between diodes 19 and 20. This alternate configuration would cause the negative ESD event to have a larger breakdown voltage than the positive ESD event. Additionally, regions 122 and 124, along with diodes 126 and 127, may be used on any of devices 10, 90, 100, or 110.

Figure 19:
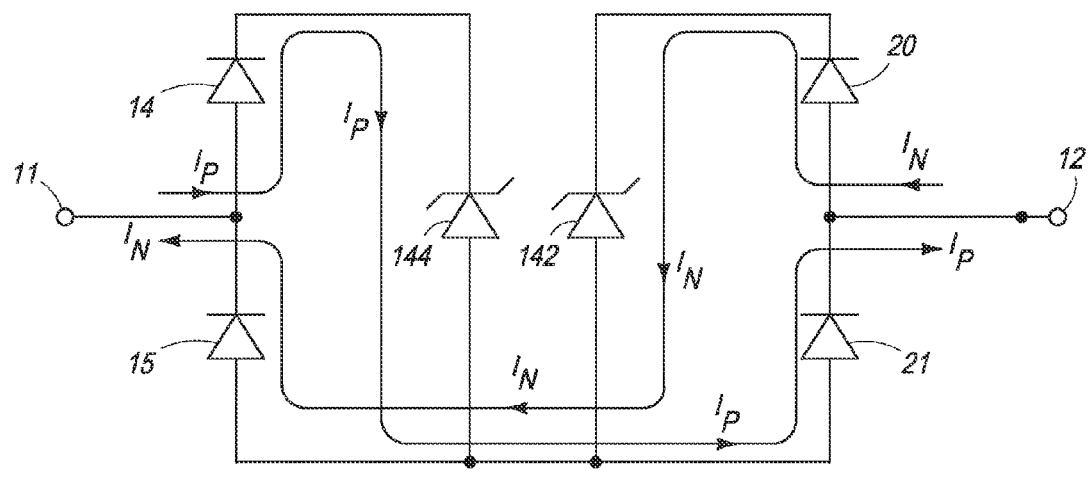
FIG. 19 schematically illustrates an embodiment of a portion of a circuit representation of another asymmetrical electro-static discharge (ESD) protection device in accordance with the present invention.

FIG. 19 schematically illustrates an embodiment of a portion of a circuit representation of an asymmetrical electrostatic discharge (ESD) protection device or ESD device 135.

Figure 20:
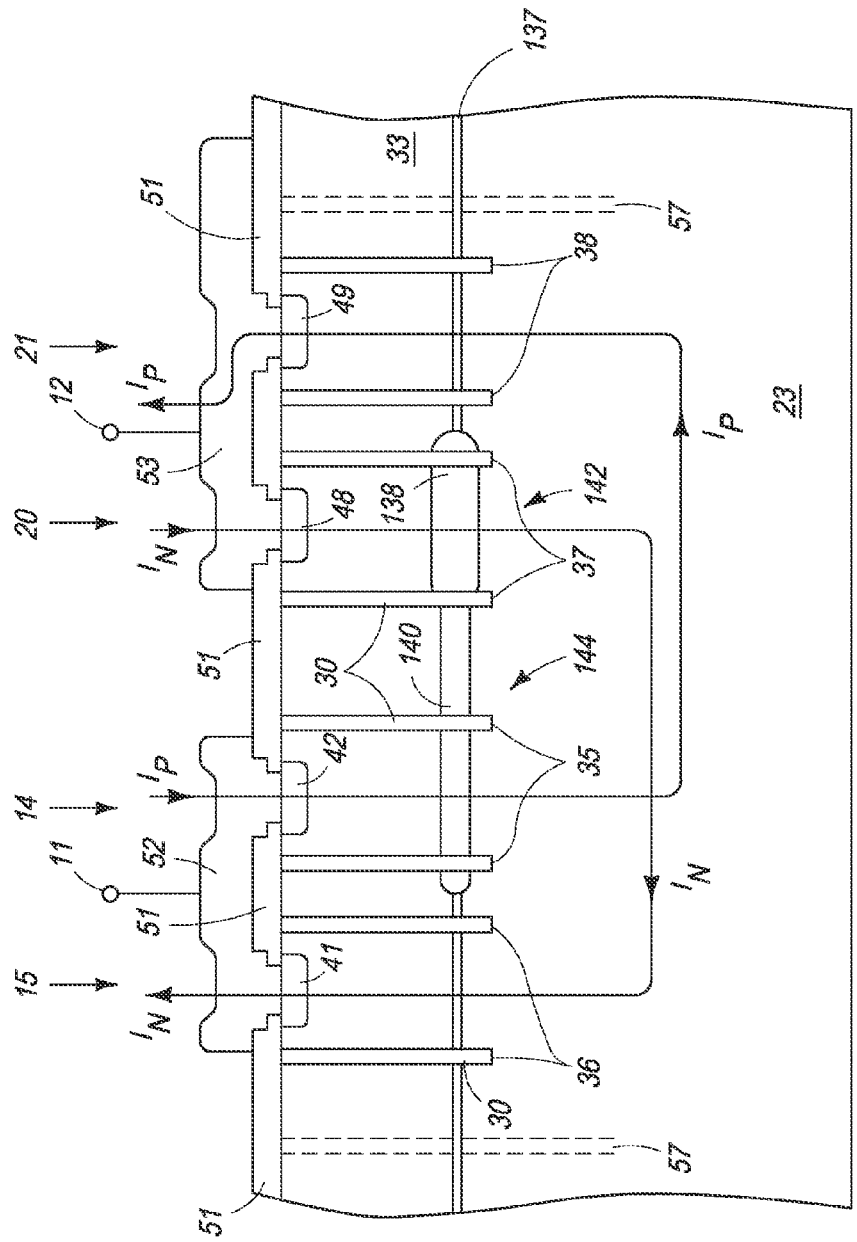
FIG. 20 illustrates a cross-sectional portion of an embodiment of the ESD device of FIG. 19 in accordance with the present invention.

FIG. 20 illustrates a cross-sectional portion of an example of an embodiment of device 135. This description has references to FIGS. 19 and 20. Device 135 is similar to devices 10, 90, and 100 except that diodes 85, 91, and 103 are omitted. Isolation layer 24 and conductor layer 25 are also omitted. Additionally, zener diodes 18 and 19 are replaced by zener diodes 144 and 142. Unlike diodes 18 and 19, diodes 142 and 144 are formed to have different breakdown voltages from each other. Thus, device 135 is an asymmetrical ESD device that has low capacitance and a fast response time as described hereinbefore. Device 135 includes substrate 23 which has a buffer layer 137 formed on the surface of substrate 23. Buffer layer 137 typically has an N-type conductivity and a low peak doping concentration and low carrier concentration. Preferably, the carrier concentration of layer 137 is between about 1E13 atoms/cm$^2$ and 1E17 atoms/cm$^2$ with a thickness of about one to twenty (1-20) microns. The peak doping concentration of layer 137 usually is approximately $1\times10^{16}$ atoms/cm$^3$ and preferably is between approximately $1\times10^{15}$ and $1\times10^{17}$ atoms/cm$^3$. A semiconductor region 138 is formed on a portion of layer 137 and a semiconductor region 140 is formed on another portion of layer 137. Regions 138 and 140 are formed to extend through layer 137 and to electrically and physically contact substrate 23 so that substrate 23 and regions 138 and 140 may form respective zener diodes 142 and 144. Regions 138 and 140 are formed to have different doping and carrier concentrations so that diodes 142 and 144 have different breakdown voltages. The different breakdown voltages cause device 135 to have different breakdown voltages for positive and negative ESD events, thus, device 135 is an asymmetrical ESD device. Those skilled in the art will appreciate that regions 138 and 140 along with diodes 142 and 144 may be used for ESD devices 10, 90, and 100.

In some embodiments, an additional blocking structure, for example trench 57, may be formed to surround the elements of diodes 14, 15, 20, 21, 142, and 144 as illustrated by dashed lines. In some embodiments, device 135 may also include region 63 and conductors 60 (not shown).

Figure 21:
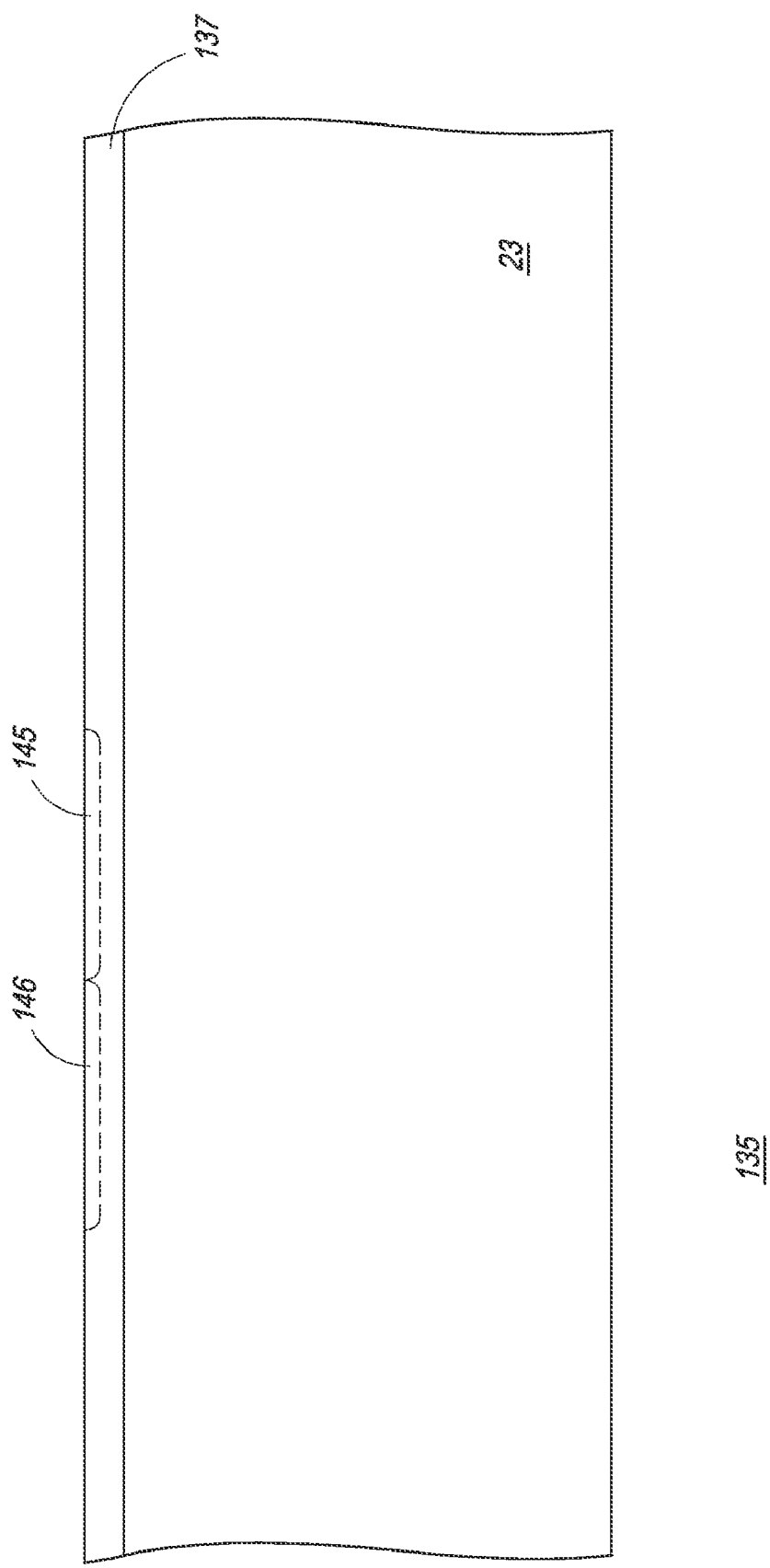
FIG. 21 through FIG. 22 illustrates various stages of some steps in an example of a method of forming the ESD device of FIG. 19 in accordance with the present invention.
Figure 22:
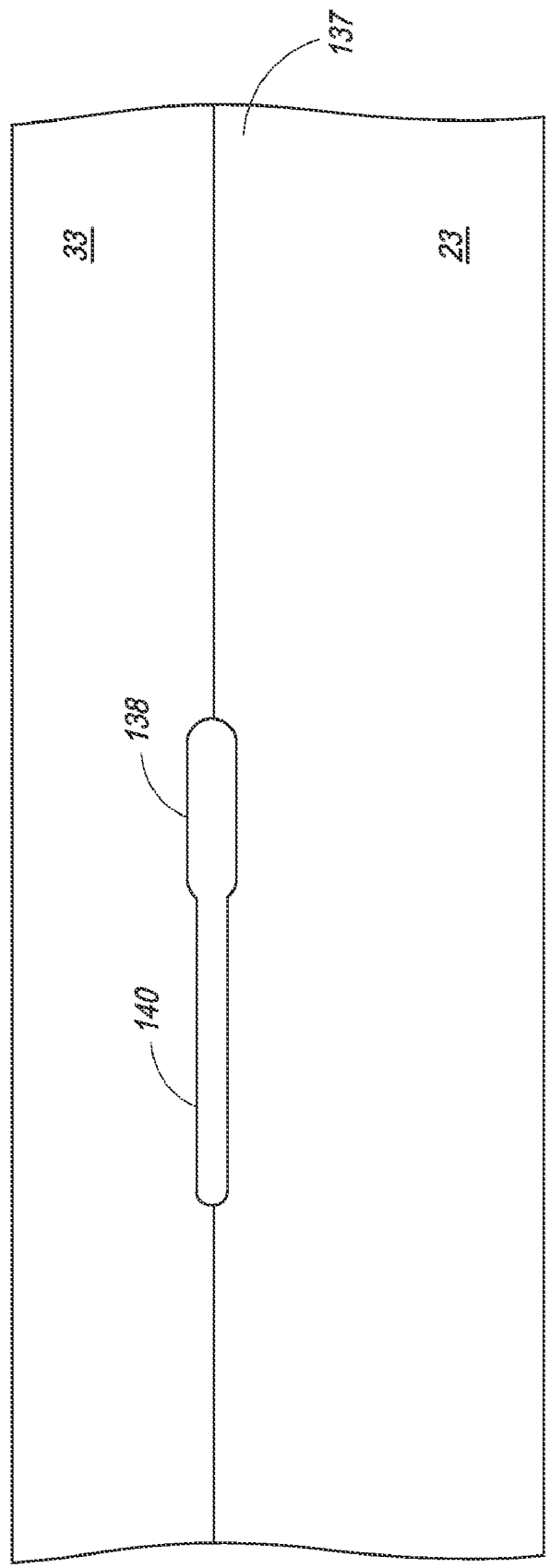

FIG. 21 through FIG. 22 illustrates various stages of some of the steps in an example method of forming ESD device 135. Buffer layer 137 is formed on the surface of substrate 23, for example by epitaxial deposition. The thickness of layer 137 is chosen to be about one to twenty (1-20) microns. A portion of layer 137 is doped, such as by ion implantation, to form a doped region 145 on the surface of layer 137 where region 138 is to be formed. A mask, not shown, typically is used to mask off the remainder of device 135 so that only region 145 is doped. The position of region 145 is illustrated by a dashed line. After forming region 145, another portion of layer 137 may be doped to form a doped region 146 that is juxtaposed to region 145, at least along one side of region 146. Another mask, not shown, typically is used to mask off the remainder of device 135 so that only region 146 is doped. Region 146 is formed in the portion of layer 137 where region 140 is desired to be formed. In some embodiments, regions 145 and 146 have different carrier concentrations. In some embodiments, the region having the lower carrier concentration may overlap into the region having the higher carrier concentration. This could provide a simpler and lower cost process and still achieve an asymmetrical ESD device.

In one embodiment, layer 137 is formed on substrate 23 by epitaxial deposition of substantially undoped silicon. During subsequent operations, dopants from substrate 23 diffuse upwards into layer 137 to assist, in achieving the desired thickness of layer 137. In addition, dopants from layer 33 diffuse downward into layer 137 to assist in forming the desired carrier concentration of layer 137 including the portion of layer 137 between substrate 23 and layer 33. The embodiment of this method assists in forming the desired thickness and carrier concentration of layer 137 while reducing the manufacturing costs. As will be understood by those skilled in the art, the up-diffusion of dopants from substrate 23 does not substantially affect the doping and carrier concentration of regions 138 and 140.

Referring to FIG. 22, regions 145 and 146 subsequently may be annealed to form resulting regions 138 and 140. Alternately, regions 145 and 146 may be annealed as a result of the heat formed during the formation of layer 33, which is subsequently formed on layer 137. In another embodiment, device 135 may be annealed after forming region 145 and then annealed again after forming region 146. Annealing region 145 twice moves more carriers into substrate 23 which reduces the carrier concentration of region 138 and lowers the breakdown voltage of resulting diode 142. The dose and energy used to form region 146 usually is less than the dose and energy used to form region 145 so that the resulting peak doping and carrier concentration of region 138 is greater than region 140. Thus, in some embodiments, region 138 may extend further into substrate 23 than region 140. The peak doping concentration of region 138 is typically between about 1E18 and 1E21 atoms/cm$^3$. The peak doping concentration of region 140 is typically less than region 138 so that diodes 142 and 144 have different breakdown voltages. Regions 145 and 146 are formed so that resulting regions 138 and 140, respectively, both physically and electrically contact substrate 23 and form respective zener diodes 144 and 142.

In one example embodiment, the peak doping concentration of region 140 is about one-half that of region 138. For this example embodiment, region 138 has a peak doping concentration of about 2E18 atoms/cm$^3$ and region 140 has a peak doping concentration of about 1E18 atoms/cm$^3$. The resulting breakdown voltages of diodes 142 and 144 are approximately 14 volts (14V) and eleven volts (11V). In another embodiment, the peak doping concentration of region 140 is about one fifth to one tenth (0.2 to 0.1) of the peak doping concentration of region 138. By controlling the carrier concentration and the position of the peak doping concentration relative to the position of the substrate, the breakdown voltage of each zener diode may be selected from a wide range of breakdown voltage values.

Figure 23:
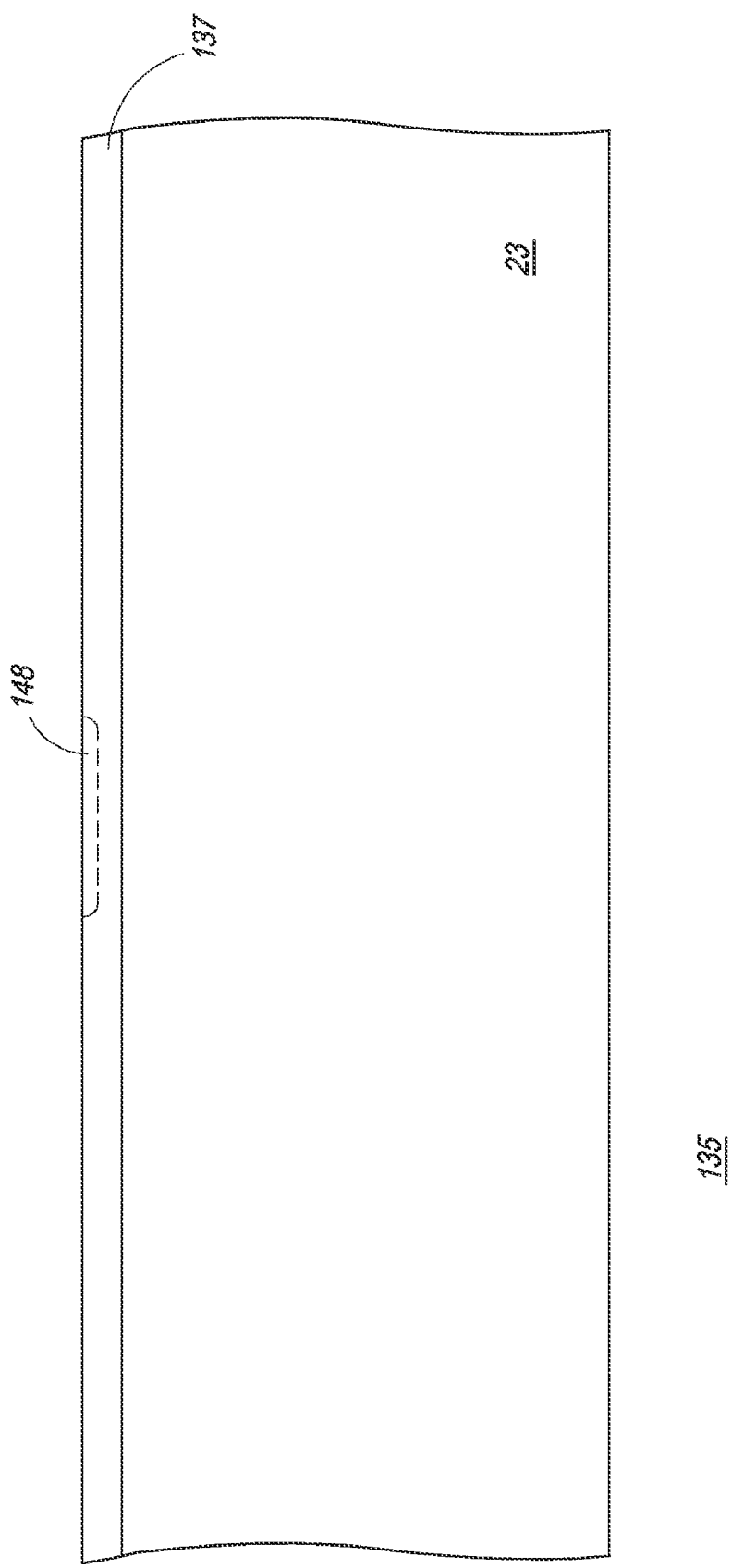
FIG. 23-24 illustrates various stages of some steps in an example of another method of forming the ESD device of FIG. 19 in accordance with the present invention.
Figure 24:
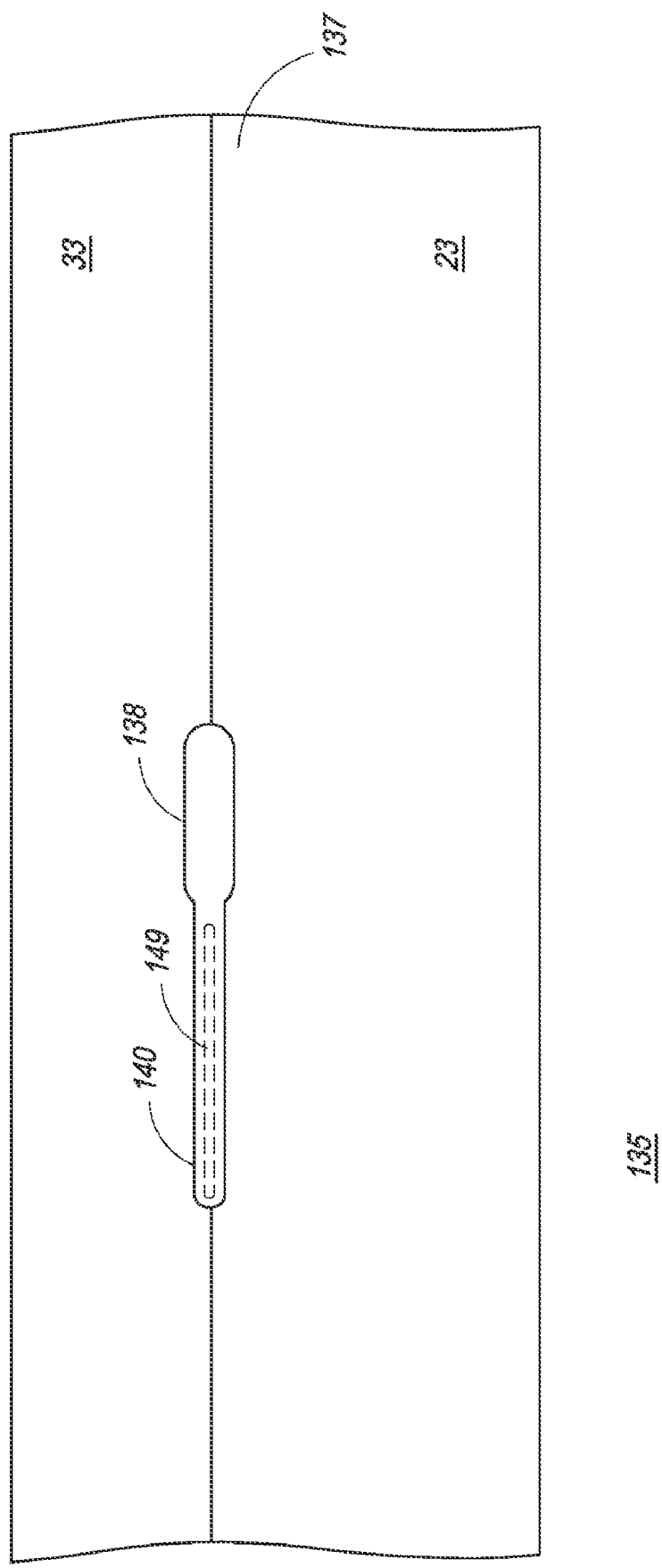

FIG. 23 through FIG. 24 illustrates various stages of some of the steps in an example of another method of forming ESD device 135. A portion of layer 137 may be doped, such as by ion implantation, to form a doped region 148 on the surface of layer 137. Region 148 is formed in the portion of layer 137 where region 138 is desired to be formed. Subsequently device 135 may be annealed to drive the dopants of region 148 further into layer 137 as illustrated by the dashed line position of region 148.

Referring to FIG. 24, after forming region 148 another portion of layer 137 may be doped to form a doped region 149, illustrated by a dashed line, that is juxtaposed to region 148. Region 149 is formed in the portion of layer 137 where region 140 is desired to be formed. In the preferred embodiment, a separate anneal step is not used to anneal or activate the dopants of region 149. Thereafter, layer 33 is formed on layer 33. The step of forming layer 33, such as by epitaxial deposition, heats device 135 and is used to drive or activate the dopants of region 149 to form region. The heat from forming layer 33 also further drives the dopants of region 148 to form region 138. Regions 148 and 149 are formed to both physically and electrically contact substrate 23 so that resulting regions 138 and 140, respectively, form respective zener diodes 144 and 142.

From all of the foregoing, one skilled in the art will appreciate that in one embodiment, an ESD device may comprise a semiconductor substrate, such as substrate 23, of a first conductivity type and having a first doping concentration, the semiconductor substrate having first and second surfaces; a first semiconductor layer, for example a layer 24, of a second conductivity type on the first surface of the semiconductor substrate, the first semiconductor layer having a first, surface that is opposite to the first surface of the semiconductor substrate and having a second doping concentration; a second semiconductor layer, such as layer 33 for example, of the second conductivity type overlying the first surface of the first semiconductor layer, the second semiconductor layer having a first surface that is opposite to the first surface of the first semiconductor layer and having a third doping concentration; a first semiconductor region, for example region 29, of the second conductivity type having at least a portion within the second semiconductor layer, the first semiconductor region forming a portion of a zener diode, such as a diode 112; a first blocking structure, for example trenches 35 and 37, formed as a first multiply-connected domain having a first periphery and extending from the first surface of the second semiconductor layer into the first semiconductor region but not through the first semiconductor region, the first periphery surrounding at least a first portion of the second semiconductor layer; and a first diode, for example one of diodes 14 or 20, within the first portion of the second semiconductor layer.

Those skilled in the art will also appreciate that in another embodiment, a method of forming an ESD device may comprise: providing a semiconductor substrate, for example substrate 23, of a first conductivity type and having first and second surfaces; forming a buffer layer, buffer layer 137 for example, of a second conductivity type on the first surface of the semiconductor substrate and having a first surface that is opposite to the first surface of the semiconductor substrate; forming a semiconductor layer, such as a layer 33, of the second conductivity type overlying the first surface of the buffer layer, the semiconductor layer, layer 33 for example, having a first surface that is opposite to the first surface of the buffer layer; forming a first semiconductor region, for example region 140, of the second conductivity type and a first doping concentration positioned between the semiconductor layer and the semiconductor substrate, the first semiconductor region forming a portion of a first zener diode, diode 144 for example; forming a second semiconductor region, such as region 138, of the second conductivity type and a second doping concentration that is greater than the first doping concentration wherein the second semiconductor region is juxtaposed to the first semiconductor region and positioned between the semiconductor layer and the semiconductor substrate, the second semiconductor region forming a portion of a second zener diode; forming a first blocking structure, trench 35 for example, extending from the first surface of the semiconductor layer into the first semiconductor region wherein a periphery of the first blocking structure forms a first multiply-connected domain that surrounds at least a first portion of the first semiconductor region, the first zener diode, and a first portion of the semiconductor layer; forming a second blocking structure, trench 37 for example, extending from the first surface of the semiconductor layer into the second semiconductor region wherein a periphery of the second blocking structure forms a second multiply-connected domain that surrounds at least a first portion of the second semiconductor region, the second zener diode, and a second portion of the semiconductor layer; forming a first diode, such as a diode 14, in the first portion of the semiconductor layer and overlying the first semiconductor region; and forming a second diode, such as a diode 20, in the second portion of the semiconductor layer and overlying the second semiconductor region.

Another embodiment of an ESD device may comprise: a semiconductor substrate, for example substrate 23, of a first conductivity type and a first doping concentration and having first and second surfaces; a first buffer layer, for example layer 137, of a second conductivity type on the first surface of the semiconductor substrate and having a first surface that is opposite to the first surface of the semiconductor substrate; a semiconductor layer, such as layer 33, of the second conductivity type overlying the first surface of the first buffer layer, the semiconductor layer having a first surface that is opposite to the first surface of the first buffer layer; a first blocking structure, such as a trench 35, extending from the first surface of the semiconductor layer, the first blocking structure having a periphery that forms a first multiply-connected domain that surrounds at least a first portion of the semiconductor layer; a first semiconductor region, for example region 140, of the second conductivity type having a first doping concentration, the first semiconductor region positioned between the semiconductor layer and the semiconductor substrate wherein at least a portion of the first semiconductor region is surrounded by the first blocking structure, the portion of the first semiconductor region forming a portion of a first zener diode, diode 142 for example; a second blocking structure, such as a trench 37, extending from the first surface of the semiconductor layer, the second blocking structure having a periphery that forms a second multiply-connected domain that surrounds at least a second portion of the semiconductor layer; a second semiconductor region, region 138 for example, of the second conductivity type having a second doping concentration that is greater than the first doping concentration, the second semiconductor region positioned between the semiconductor layer and the semiconductor substrate wherein at least a portion of the second semiconductor region is surrounded by the second blocking structure, the portion of the second semiconductor region forming a portion of a second zener diode, such as diode 142; a first diode, for example diode 14, in the first portion of the semiconductor layer and overlying the portion of the first semiconductor region; and a second diode, such as a diode 20, in the second portion of the semiconductor layer and overlying the portion of the second semiconductor region.

In view of all of the above, it is evident that a novel device and method is disclosed. Included, among other features, is forming an ESD device that has an isolation layer formed between the diodes of the ESD device and the substrate on which the device is formed. The isolation layer isolates the diodes from the substrate and facilitates forming the ESD device as a two terminal device. Forming the conductor layer underlying the diodes facilitates forming a lateral current path to interconnect the anodes of the diodes together. Additionally, forming a blocking structure to surround each of the diodes forces the lateral current flow to occur within the conductor layer and prevents lateral current flow that could short the diodes together. Forming the vertical conductor to facilitate forming electrical connection, to the substrate assists in configuring the device to operate from two terminals. Forming another blocking structure to isolate the diodes from the vertical conductor assists in preventing shorts from the diodes to the terminals of the ESD device. Additionally, the ESD device usually has a highly doped. P-type substrate, a lightly doped N-type layer in which the diodes are formed, and a highly doped N-type layer that is positioned adjacent to a portion of the lightly doped N-type layer in order to form a zener diode. Also included is a highly doped P-type layer overlying the highly doped N-type layer in order to form P-N diodes. The doping concentrations and thicknesses result in an ESD device that can respond to an ESD event within less than one nanosecond (1 nsec.). In another embodiment, the ESD device is formed to be asymmetrical and have different breakdown voltages for the negative and positive ESD events.

While the subject matter of the inventions are described with specific preferred embodiments, it is evident that many alternatives and variations will be apparent to those skilled in the semiconductor arts. For example, all the doping types may be reversed. Isolation layer 24 can be any type of layer that provides isolation between layer 25 and substrate 33 including a semiconductor dielectric such as silicon dioxide. Although semiconductor region 29 is described as being formed by doping a portion of an epitaxial layer, region 29 may be formed by a variety of well-known techniques. Additionally, the doping described for isolation layer 24 may be replaced by other techniques that will kill or reduce the carrier lifetime within layer 24 sufficiently to inhibit enabling the bipolar transistor. Those skilled in the art will appreciate that the buffer layer may be formed by means other than epitaxial deposition. Additionally, regions 138 an 140 along with resulting diodes 142 and 144 may be formed using various techniques as long as the breakdown voltages of diodes 142 and 144 are different.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those in the art. Although the devices were described herein as being formed on a silicon substrate, those skilled in the art will appreciate that other semiconductor materials may be used including gallium arsenide, silicon carbide, gallium nitride, and other semiconductor materials. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming an ESD device comprising:
   providing a semiconductor substrate of a first conductivity type and having first and second surfaces;
   forming a buffer layer of a second conductivity type on the first surface of the semiconductor substrate and having a first surface that is opposite to the first surface of the semiconductor substrate;
   forming a semiconductor layer of the second conductivity type overlying the first surface of the buffer layer, the semiconductor layer having a first surface that is opposite to the first surface of the buffer layer;
   forming a first semiconductor region of the second conductivity type and a first doping concentration positioned between the semiconductor layer and the semiconductor substrate, the first semiconductor region forming a portion of a first zener diode;
   forming a second semiconductor region of the second conductivity type and a second doping concentration that is greater than the first doping concentration wherein the second semiconductor region is juxtaposed to the first semiconductor region and positioned between the semiconductor layer and the semiconductor substrate, the second semiconductor region forming a portion of a second zener diode;
   forming a first blocking structure extending from the first surface of the semiconductor layer into the first semiconductor region wherein a periphery of the first blocking structure forms a first multiply-connected domain that surrounds at least a first portion of the first semiconductor region, the first zener diode, and a first portion of the semiconductor layer;
   forming a second blocking structure extending from the first surface of the semiconductor layer into the second semiconductor region wherein a periphery of the second blocking structure forms a second multiply-connected domain that surrounds at least a first portion of the second semiconductor region, the second zener diode, and a second portion of the semiconductor layer;
   forming a first diode in the first portion of the semiconductor layer and overlying the first semiconductor region; and
   forming a second diode in the second portion of the semiconductor layer and overlying the second semiconductor region.

2. The method of claim 1 wherein forming the buffer layer includes forming the buffer layer having a carrier concentration that is less than a carrier concentration of the semiconductor layer and less than a carrier concentration of the first semiconductor region.

3. The method of claim 2 wherein forming the buffer layer includes forming the buffer layer to have a carrier concentration of no greater than approximately 1E17 atoms/cm$^2$; and forming the carrier concentration of the first semiconductor region no greater than approximately 1E15 atoms/c$^2$.

4. The method of claim 1 further including forming the third blocking structure extending from the first surface of the semiconductor layer into the semiconductor substrate wherein a periphery of the third blocking structure forms a third multiply-connected domain that surrounds the first and second blocking structures.

5. The method of claim 1 wherein forming the semiconductor layer includes forming the semiconductor layer with a doping concentration that is less than the first doping concentration.

6. The method of claim, 5 wherein forming the semiconductor layer includes forming the semiconductor layer with the doping concentration that is no greater than approximately one half of the first doping concentration.

7. The method of claim 1 wherein the steps of forming the first and second semiconductor regions include doping a first portion of the buffer layer with a first dose of dopants of the second conductivity type and activating the dopants, then doping a second portion of the buffer layer with a second dose of dopants of the second conductivity type wherein the second dose is less than the first dose and not using a separate activation step to activate the dopants of the second dose wherein the step of forming the semiconductor layer activates the dopants of the second dose.

* * * * *